United States Patent
Katou et al.

(10) Patent No.: US 11,286,423 B2
(45) Date of Patent: Mar. 29, 2022

(54) LAMINATE, MANUFACTURING METHOD OF LAMINATE, AND IMAGE DISPLAY DEVICE

(71) Applicant: FUJIFILM Corporation, Tokyo (JP)

(72) Inventors: Yumi Katou, Kanagawa (JP); Jun Takeda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 2 days.

(21) Appl. No.: 16/983,263

(22) Filed: Aug. 3, 2020

(65) Prior Publication Data

US 2020/0362247 A1 Nov. 19, 2020

Related U.S. Application Data

(63) Continuation of application No. PCT/JP2019/003882, filed on Feb. 4, 2019.

(30) Foreign Application Priority Data

Feb. 6, 2018 (JP) .............................. JP2018-018916

(51) Int. Cl.
*C09K 19/56* (2006.01)
*C09K 19/38* (2006.01)
(Continued)

(52) U.S. Cl.
CPC .......... *C09K 19/3852* (2013.01); *C09K 19/56* (2013.01); *C09K 19/601* (2013.01);
(Continued)

(58) Field of Classification Search
CPC ............ C09K 2323/00; C09K 2323/02; C09K 2323/031; C09K 19/56; C09K 19/601; G02B 5/3083; H01L 27/32
(Continued)

(56) References Cited

U.S. PATENT DOCUMENTS 6,798,487 B1 9/2004 Ohtani et al.
2013/0083394 A1 4/2013 Takeda et al.
(Continued)

FOREIGN PATENT DOCUMENTS

CN 104345367 A 2/2015
CN 106716193 A 5/2017
(Continued)

OTHER PUBLICATIONS

International Search Report issued in PCT/JP2019/003882 dated Apr. 23, 2019.
(Continued)

*Primary Examiner* — Ruiyun Zhang
(74) *Attorney, Agent, or Firm* — Edwards Neils LLC; Jean C. Edwards, Esq.

(57) ABSTRACT

A laminate is provided having excellent adhesiveness between a light absorption anisotropic film and a barrier layer, a manufacturing method of the laminate, and an image display device using the laminate. A laminate having: a barrier layer A; and a light absorption anisotropic film B, in which the barrier layer A is adjacently provided on the light absorption anisotropic film B, a relationship between a highest content of a compound A1 contained in the barrier layer A and a highest content of a compound B1 contained in the light absorption anisotropic film B satisfies a relationship in which a value of distance calculated from Hansen solubility parameters and represented by Formula (I) is within a range of 0.0 to 5.0, and the light absorption anisotropic film B contains a component same as the compound A1.

$$\text{distance} = \{4 \times (\delta_{D(B1)} - \delta_{D(A1)})^2 + (\delta_{P(B1)} - \delta_{P(A1)})^2 + (\delta_{H(B1)} - \delta_{H(A1)})^2\}^{0.5} \quad \text{(I)}$$

18 Claims, 1 Drawing Sheet

(51) Int. Cl.
  *C09K 19/60* (2006.01)
  *G02B 5/30* (2006.01)
  *H01L 27/32* (2006.01)

(52) U.S. Cl.
  CPC ............ *G02B 5/3083* (2013.01); *H01L 27/32* (2013.01); *C09K 2323/00* (2020.08); *C09K 2323/03* (2020.08); *C09K 2323/031* (2020.08)

(58) Field of Classification Search
  USPC .................... 428/1, 1.3, 1.31; 359/487.01
  See application file for complete search history.

(56) References Cited

U.S. PATENT DOCUMENTS

| | | | |
|---|---|---|---|
| 2015/0029445 A1 | 1/2015 | Takeda et al. | |
| 2015/0062505 A1* | 3/2015 | Hatanaka | B32B 17/10504 349/98 |
| 2015/0337203 A1 | 11/2015 | Hida et al. | |
| 2017/0123124 A1 | 5/2017 | Hatanaka et al. | |
| 2017/0306197 A1 | 10/2017 | Shimokawa et al. | |
| 2018/0037680 A1 | 2/2018 | Saito et al. | |

FOREIGN PATENT DOCUMENTS

| | | | | |
|---|---|---|---|---|
| JP | 2001-091747 A | 4/2001 | | |
| JP | 2003-156624 A | 5/2003 | | |
| JP | 2010-256895 A | 11/2010 | | |
| JP | 2013-037353 A | 2/2013 | | |
| JP | 2013-083953 A | 5/2013 | | |
| JP | 2015-163934 A | 9/2015 | | |
| JP | 2016-006502 A | 1/2016 | | |
| JP | 2017-058659 A | 3/2017 | | |
| JP | 2017-068235 A | 4/2017 | | |
| JP | 2017-083843 A | 5/2017 | | |
| JP | 2017-134414 A | 8/2017 | | |
| JP | 2017-173434 A | 9/2017 | | |
| JP | 2017173434 A | * | 9/2017 | ............ B32B 27/30 |
| JP | 2017-194633 A | 10/2017 | | |
| JP | 2018-128573 A | 8/2018 | | |
| WO | 2017/115784 A1 | 7/2017 | | |

OTHER PUBLICATIONS

Written Opinion issued in PCT/JP2019/003882 dated Apr. 23, 2019.
International Preliminary Report on Patentability completed by WIPO dated Aug. 11, 2020 in connection with International Patent Application No. PCT/JP2019/003882.
Office Action, issued by the Japanese Patent Office dated Jul. 6, 2021, in connection with Japanese Patent Application No. 2019-570735.
Office Action, issued by the State Intellectual Property Office dated Sep. 14, 2021, in connection with Chinese Patent Application No. 201980011968.5.
Wang Zhan, Fundamentals of membrane Separation Techniques, Apr. 2000, Hansen, 1st Edition, pp. 59-82, Chemical Industry Press.
Office Action, issued by the Japanese Patent Office dated Feb. 1, 2022, in connection with Japanese Patent Application No. 2019-570735.

* cited by examiner

LAMINATE, MANUFACTURING METHOD OF LAMINATE, AND IMAGE DISPLAY DEVICE

CROSS-REFERENCE TO RELATED APPLICATIONS

This application is a Continuation of PCT International Application No. PCT/JP2019/003882 filed on Feb. 4, 2019, which was published under PCT Article 21(2) in Japanese, and which claims priority under 35 U.S.C. § 119(a) to Japanese Patent Application No. 2018-018916 filed on Feb. 6, 2018. The above applications are hereby expressly incorporated by reference, in their entirety, into the present application.

BACKGROUND OF THE INVENTION

1. Field of the Invention

The present invention relates to a laminate, a manufacturing method of the laminate, and an image display device.

2. Description of the Related Art

In the past, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing processes for each function.

For example, in liquid crystal displays (LCDs), a linearly polarizing plate or a circularly polarizing plate is used to control optical activity and a birefringent property in display. In addition, in organic light emitting diodes (OLEDs), a circularly polarizing plate is used to prevent external light from being reflected.

Iodine has been widely used as a dichroic substance in these polarizing plates (polarizing elements). However, a polarizing element using an organic dye as a dichroic substance instead of iodine has also been examined.

For example, JP2016-006502A describes a polarizing film formed from a composition containing a predetermined azo dye and a polymerizable liquid crystal compound ([claim 1]).

SUMMARY OF THE INVENTION

The inventors have studied the polarizing film described in JP2016-006502A, and found that the high-temperature durability and the moisture-heat resistance deteriorate depending on the layer configuration of the laminate including the polarizing film.

In addition, the inventors have studied an aspect in which a barrier layer is provided adjacent to the polarizing film from the viewpoint of improving the durability, and found that in a case where the dichroic substance has a high alignment degree, adhesiveness between the barrier layer and the polarizing film deteriorates.

An object of the present invention is to provide a laminate having excellent adhesiveness between a light absorption anisotropic film and a barrier layer, a manufacturing method of the laminate, and an image display device using the laminate.

The inventors have conducted intensive studies to achieve the object, and as a result, found that in a case where a relationship between a highest content of a compound contained in the light absorption anisotropic film and a highest content of a compound contained in the barrier layer is provided such that a value of distance calculated from Hansen solubility parameters satisfies a predetermined range, adhesiveness between the light absorption anisotropic film and the barrier layer is improved, and completed the present invention.

That is, the inventors have found that the object can be achieved with the following configuration.

[1] A laminate comprising: a barrier layer A; and a light absorption anisotropic film B,
in which the barrier layer A is adjacently provided on the light absorption anisotropic film B,
a relationship between a highest content of a compound A1 contained in the barrier layer A and a highest content of a compound B contained in the light absorption anisotropic film B satisfies a relationship in which a value of distance calculated from Hansen solubility parameters and represented by Formula (I) is within a range of 0.0 to 5.0, and
the light absorption anisotropic film B contains a component same as the compound A1.

[2] The laminate according to [1], further comprising: a transparent support on a side of the light absorption anisotropic film B opposite to the barrier layer A; and an alignment film between the transparent support and the light absorption anisotropic film B.

[3] The laminate according to [2], in which the alignment film contains a component same as the compound A1.

[4] The laminate according to any one of [1] to [3], in which a visibility-corrected alignment degree of the light absorption anisotropic film B is 0.90 or greater.

[5] The laminate according to any one of [1] to [4], in which the compound B1 is a compound represented by Formula (1) or a polymer thereof.

[6] The laminate according to any one of [1] to [5], in which the light absorption anisotropic film B is a film formed using a composition containing the compound B1 and a dichroic substance.

[7] The laminate according to any one of [1] to [6], further comprising: an adhesive layer on a side of the barrier layer A opposite to the light absorption anisotropic film B.

[8] The laminate according to [7], further comprising: λ/4 plate on a side of the adhesive layer opposite to the barrier layer A.

[9] A manufacturing method of a laminate having a barrier layer A and a light absorption anisotropic film B, the method comprising:
a light absorption anisotropic film forming step of forming the light absorption anisotropic film B containing 50 mass % or greater of a compound B1 using a composition containing the compound B1; and
a barrier layer forming step of forming the barrier layer A containing 50 mass % or greater of a compound A1 on the light absorption anisotropic film B using a composition containing the compound A1,
in which a relationship between the compound A1 and the compound B1 satisfies a relationship in which a value of distance calculated from Hansen solubility parameters and represented by Formula (I) is within a range of 0.0 to 5.0.

[10] An image display device comprising: the laminate according to any one of [1] to [8]; and a display element which is installed on a side of the barrier layer A opposite to the light absorption anisotropic film B of the laminate.

According to the present invention, it is possible to provide a laminate having excellent adhesiveness between a light absorption anisotropic film and a barrier layer, a manufacturing method of the laminate, and an image display device using the laminate.

DESCRIPTION OF THE PREFERRED EMBODIMENTS

Figure 1:
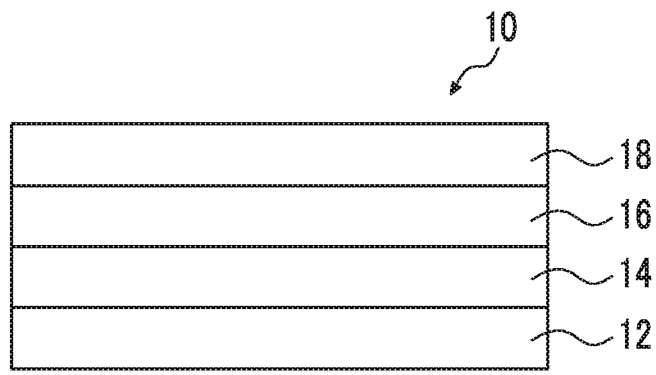
FIG. 1 is a schematic cross-sectional view showing an example of a laminate according to an embodiment of the present invention.

Hereinafter, the present invention will be described in detail.

The following description of constituent requirements is based on typical embodiments of the present invention, but the present invention is not limited thereto.

In this specification, a numerical value range expressed using "to" means a range including numerical values before and after "to" as a lower limit value and an upper limit value.

In this specification, the term "(meth)acryl" refers to "acryl" or "methacryl", and the term "(meth)acrylate" refers to "acrylate" or "methacrylate".

[Laminate]

A laminate according to an embodiment of the present invention is a laminate having a barrier layer A and a light absorption anisotropic film B.

In the laminate according to the embodiment of the present invention, the barrier layer A is adjacently provided on the light absorption anisotropic film B.

A relationship between a highest content of a compound A1 contained in the barrier layer A of the laminate according to the embodiment of the present invention and a highest content of a compound B1 contained in the light absorption anisotropic film B satisfies a relationship in which a value of distance calculated from Hansen solubility parameters (hereinafter, also referred to as "HSP value") and represented by Formula (I) is within a range of 0.0 to 5.0.

The light absorption anisotropic film B of the laminate according to the embodiment of the present invention contains a component same as the compound A1.

$$\text{distance} = \{4 \times (\delta_{D(B1)} - \delta_{D(A1)})^2 + (\delta_{P(B1)} - \delta_{P(A1)})^2 + (\delta_{H(B1)} - \delta_{H(A1)})^2\}^{0.5} \quad (1)$$

In Formula (I), $\delta_D$ represents a dispersion element of the Hansen solubility parameter, $\delta_P$ represents a polarity element of the Hansen solubility parameter, and $\delta_H$ represents a hydrogen bond element of the Hansen solubility parameter.

In a case where the compound A1 is a polymer, $\delta_{D(A1)}$, $\delta_{P(A1)}$, and $\delta_{H(A1)}$ in Formula (I) each are a Hansen solubility parameter of a monomer which forms a highest content of a repeating unit among repeating units of the polymer.

In addition, in a case where the compound A1 is a polymer, the component same as the compound A1 contained in the light absorption anisotropic film B refers to a component same as the polymer, or a component same as a monomer which forms a highest content of a repeating unit among repeating units of the polymer.

Here, details of the HSP value are described in Hansen, Charles (2007). Hansen Solubility Parameters: A user's handbook, Second Edition. Boca Raton, Fla.: CRC Press. ISBN 9780849372483.

The HSP value is calculated by inputting the structural formula of the compound into the following software. As the software, HSPiP (Hansen Solubility Parameters in Practice) ver. 4. 1. 07 is used.

In the present invention, as described above, the relationship between the highest content of the compound A1 contained in the barrier layer A and the highest content of the compound B1 contained in the light absorption anisotropic film B satisfies a relationship in which a value of distance calculated from Hansen solubility parameters and represented by Formula (I) is within a range of 0.0 to 5.0, and thus adhesiveness between the barrier layer A and the light absorption anisotropic film B is improved.

The reason for this has not yet been clarified in detail, but is presumed by the inventors as follows.

First, the inventors have examined the cause of deterioration in the adhesiveness between the barrier layer and the light absorption anisotropic film, and found that the adhesiveness remarkably deteriorates in a case where the dichroic substance in the light absorption anisotropic film has a high alignment degree.

Accordingly, the reason why the adhesiveness is improved in the present invention is thought to be that since the relationship in which the value of distance represented by Formula (I) is within a range of 0.0 to 5.0 is satisfied, the component same as the highest content of the compound A1 contained in the barrier layer A penetrates into the light absorption anisotropic film B, and as a result, brittleness of the light absorption anisotropic film B is reduced (toughness is improved).

In the present invention, since the adhesiveness between the barrier layer A and the light absorption anisotropic film B is improved, the relationship between the highest content of the compound A1 contained in the barrier layer A and the highest content of the compound B1 contained in the light absorption anisotropic film B preferably satisfies a relationship in which the value of distance represented by Formula (I) is within a range of 0.5 to less than 3.5, and more preferably 1.0 to 3.0.

Figure 2:
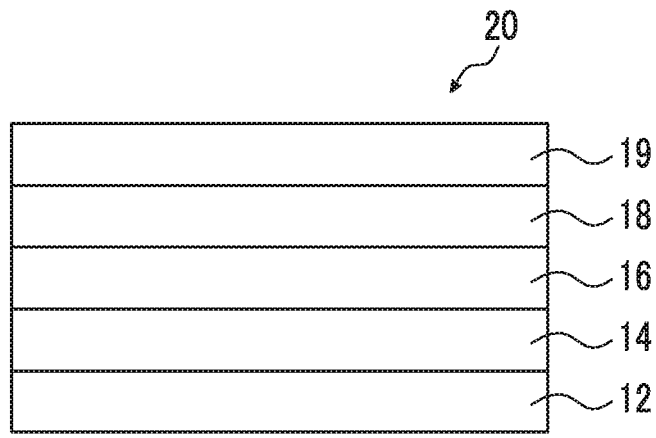
FIG. 2 is a schematic cross-sectional view showing an example of a laminate according to an embodiment of the present invention.

FIGS. 1 and 2 show schematic cross-sectional views showing an example of the laminate according to the embodiment of the present invention.

Here, a laminate 10 shown in FIG. 1 has a layer configuration having a transparent support 12, an alignment film 14, a light absorption anisotropic film 16, and a transparent resin layer 18 in this order.

A laminate 20 shown in FIG. 2 has a layer configuration having a transparent support 12, an alignment film 14, a light absorption anisotropic film 16, a transparent resin layer 18, and an adhesive layer 19 in this order.

The examples shown in FIGS. 1 and 2 show an aspect in which the laminate according to the embodiment of the present invention has a transparent support and an alignment film, but the laminate according to the embodiment of the present invention is not limited to this aspect. The laminate according to the embodiment of the present invention may have neither the transparent support not the alignment film.

Figure 3:
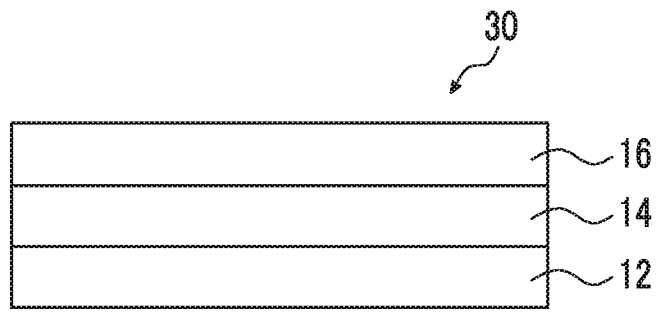
FIG. 3 is a schematic cross-sectional view showing an example of a laminate of a comparative example.
Figure 4:
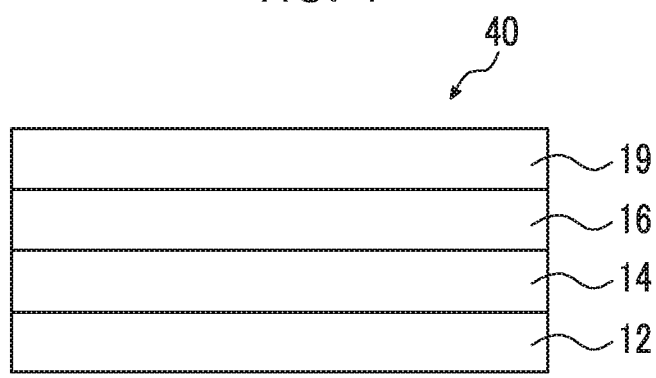
FIG. 4 is a schematic cross-sectional view showing an example of a laminate of a comparative example.

FIGS. 3 and 4 are schematic cross-sectional views showing an example of a laminate of a comparative example.

Here, a laminate 30 shown in FIG. 3 has a layer configuration having a transparent support 12, an alignment film 14, and a light absorption anisotropic film 16 in this order. A laminate 40 shown in FIG. 4 has a layer configuration having a transparent support 12, an alignment film 14, a light absorption anisotropic film 16, and an adhesive layer 19 in this order.

[Barrier Layer A]

The barrier layer A of the laminate according to the embodiment of the present invention is a layer adjacently provided on the light absorption anisotropic film B to be described later.

<Compound A1>

The highest content of the compound A1 contained in the barrier layer A is not particularly limited as long as the relationship thereof with the highest content of the compound B1 contained in the light absorption anisotropic film B to be described later satisfies a relationship in which the value of distance represented by Formula (I) is within a range of 0.0 to 5.0, and is preferably a polymerizable compound or a polymer obtained by polymerizing the polymerizable compound.

Examples of the polymerizable compound include a monofunctional polymerizable compound containing one polymerizable group in one molecule and a polyfunctional polymerizable compound containing two or more same or different polymerizable groups in one molecule.

Examples of the polymerizable group include a radically polymerizable group and a cationically polymerizable group.

Examples of the radically polymerizable group include an ethylenically unsaturated bond group.

Examples of the cationically polymerizable group include an epoxy group and an oxetane group, and an epoxy group is preferable.

Examples of the ethylenically unsaturated bonding group include an acryloyl group, a methacryloyl group, a vinyl group, a styryl group, and an allyl group, and an acryloyl group and a methacryloyl group are preferable.

Specific examples of the polymerizable compound include compounds represented by the following formulae. Among these, 3',4'-epoxycyclohexylmethyl-3,4-epoxycyclohexanecarboxylate represented by the following CEL2021P Is preferable.

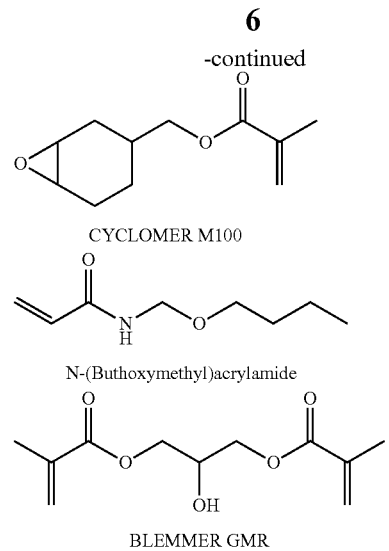

CEL2021P

2-Phenoxyethyl Acrylate

2-Phenoxyethyl Methacrylate

-continued

CYCLOMER M100

N-(Buthoxymethyl)acrylamide

BLEMMER GMR

In the present invention, the content of the compound A1 in the barrier layer A is preferably 50 to 100 mass %, and more preferably 50 to 99 mass %.

Here, the content of the compound A1 can be calculated as follows: the laminate according to the embodiment of the present invention is obliquely cut at an angle of 1° with respect to the surface of the laminate, and a portion corresponding to the barrier layer A in the formed cross-section is subjected to mapping measurement by a time-of-flight secondary ion mass spectrometer (Time-of-Flight Secondary Ion Mass Spectrometry: TOF-SIMS) to calculate the content of the compound A1 from a peak intensity ratio of the fragment ion detected specifically. Specifically, it can be confirmed by TOF-SIMS under the following measurement conditions.

In addition, the content of the compound A1 can be measured and calculated in the same manner after exposure of the barrier layer A by etching.

<Measurement Conditions of TOF-SIMS>

The measurement by TOF-SIMS in the present invention is performed as follows.

Device: TOF-SIMS 4 (manufactured by ION-TOF GmbH)
Primary Ion: $Bi^{3+}$ (25 kV, 0.2 pA)
Charging Correction: combination with 20 eV low-speed electron gun
Measurement Range: 200×200 μm
Raster: 256×256 pixels
Number of Integration Times: 16 times
Polarity: posi, nega <Forming Method>

Examples of the forming method of the barrier layer A include a method in which a composition containing the above-described compound A1 (hereinafter, also referred to as "barrier layer forming composition") is applied to the light absorption anisotropic film B to be described later and dried, and then fixing is performed by polymerization.

Here, the application method is not particularly limited, and examples thereof include a dip coating method, an air knife coating method, a curtain coating method, a roller coating method, a die coating method, a wire bar coating method, and a gravure coating method.

Here, the polymerization conditions are not particularly limited, and ultraviolet rays are preferably used in the polymerization by light irradiation. The irradiation dose is preferably 10 $mJ/cm^2$ to 50 $J/cm^2$, more preferably 20 mJ/cm² to 5 J/cm², even more preferably 30 mJ/cm² to 3 J/cm², and particularly preferably 50 to 1,000 m/cm². The polymerization may be performed under heating conditions in order to accelerate the polymerization reaction.

<Polymerization Initiator>

The barrier layer forming composition may contain a polymerization initiator.

The polymerization initiator is not particularly limited, and is preferably a photosensitive compound, that is, a photoradical polymerization initiator, or a photocationic polymerization initiator (photoacid generator).

As the photoradical polymerization initiator, various kinds of compounds can be used with no particular limitation. Examples of the photoradical polymerization initiator include a-carbonyl compounds (the specifications of U.S. Pat. Nos. 2,367,661A and 2,367,670A), acyloin ethers (the specification of U.S. Pat. No. 2,448,828A), aromatic acyloin compounds substituted by a-hydrocarbon (the specification of U.S. Pat. No. 2,722,512A), polynuclear quinone compounds (the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), and acylphosphine oxide compounds (JP1988-040799B (JP-S63-040799B), JP1993-029234B (JP-H5-029234B), JP1998-095788A (JP-H10-095788A), and JP1998-029997A (JP-H10-029997A)).

A commercially available product can also be used as the photoradical polymerization initiator, and examples thereof include IRGACURE 184, IRGACURE 907, IRGACURE 369, IRGACURE 651, IRGACURE 819, and IRGACURE OXE-01 manufactured by BASF SE.

The photocationic polymerization initiator (cationic photopolymerization initiator) may be any one which can generate a cation as an active species by light irradiation, and a known cationic photopolymerization initiator can be used with no limitation.

Specific examples thereof include known sulfonium salts, ammonium salts, iodonium salts (for example, diaryliodonium salts), triarylsulfonium salts, diazonium salts, and iminium salts.

More specific examples thereof include cationic photopolymerization initiators represented by Formulae (25) to (28) shown in paragraphs [0050] to [0053] of JP1996-143806A (JP-H8-143806A) and examples of the cationic polymerization catalyst shown in paragraph [0020] of JP1996-283320 (JP-H8-283320A), the contents of which are incorporated herein.

The cationic photopolymerization initiator can be synthesized by a known method, and is also available as a commercially available product. Examples of the commercially available product include CI-1370, CI-2064, CI-2397, CI-2624, CI-2639, CI-2734, CI-2758, CI-2823, CI-2855, and CI-5102 manufactured by Nippon Soda Co., Ltd.; PHOTOINITIATOR 2047 manufactured by RHODIA; UVI-6974 and UVI-6990 manufactured by Union Carbide Corporation, and CPI-10P manufactured by San-Apro Ltd.

As the cationic photopolymerization initiator, diazonium salts, iodonium salts, sulfonium salts, and iminium salts are preferable from the viewpoint of the sensitivity of the photopolymerization initiator to light, the stability of the compound, and the like. From the viewpoint of weather fastness, iodonium salts are most preferable.

Specific examples of the iodonium salt-based cationic photopolymerization initiator include diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-t-butylphenyl)iodonium trifluoromethanesulfonate, bis(4-t-butylphenyl)iodonium dodccylbenzcnesulfonate, bis(4-t-butylphenyl)iodonium naphthalenesulfonate, bis(4-t-butylphenyl)iodonium hexafluoroantimonate, bis(4-t-butylphenyl)iodonium nonafluoro-n-butanesulfonate, and diphenyliodonium hexafluoroantimonate.

Specific examples of the commercially available iodonium salt-based cationic photopolymerization initiators include B2380 manufactured by Tokyo Chemical Industry Co., Ltd., BBI-102 manufactured by Midori Kagaku Co., Ltd., WPI-113 manufactured by Wako Pure Chemical Corporation, WPI-124 manufactured by Wako Pure Chemical Corporation, WPI-169 manufactured by Wako Pure Chemical Corporation, WPI-170 manufactured by Wako Pure Chemical Corporation, and DTBPI-PFBS manufactured by Toyo Gosci Co., Ltd.

Specific examples of the iodonium salt compound usable as the cationic photopolymerization initiator include the following compounds PAG-1 and PAG-2.

Cationic Photopolymerization Initiator (Iodonium Salt Compound) PAG-1

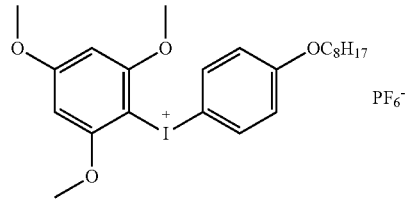

Cationic Photopolymerization Initiator (Iodonium Salt Compound) PAG-2

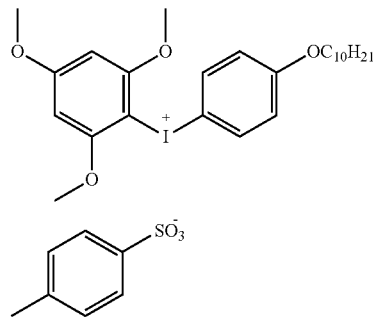

In a case where the barrier layer forming composition contains a polymerization initiator, the content of the polymerization initiator is preferably 0.1 to 10 parts by mass, and more preferably 1 to 6 parts by mass with respect to 100 parts by mass of the compound A1 (particularly, the above-described polymerizable compound) in the barrier layer forming composition.

<Solvent>

From the viewpoint of workability and the like, the barrier layer forming composition preferably contains a solvent.

Examples of the solvent include organic solvents such as ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane, dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, organic solvents are preferably used, and halogenated carbons or ketones are more preferably used.

In a case where the barrier layer forming composition contains a solvent, the content of the solvent is preferably 0 to 99 mass %, more preferably 30 to 95 mass %, and even more preferably 50 to 80 mass % with respect to the total mass of the barrier layer forming composition.

In the present invention, the thickness of the barrier layer A is not particularly limited. The thickness is preferably 0.1 to 10 µm, and more preferably 0.5 to 5 µm.

[Light Absorption Anisotropic Film B]

The light absorption anisotropic film B of the laminate according to the embodiment of the present invention is a light absorption anisotropic film containing, as a maximum content component, the compound B1 of which the relationship with the highest content of the compound A1 contained in the barrier layer A adjacent to the light absorption anisotropic film B satisfies a relationship in which the value of distance represented by Formula (I) is within a range of 0.0 to 5.0. The compound B1 is a compound different from the compound A1.

The light absorption anisotropic film B of the laminate according to the embodiment of the present invention contains a component same as the highest content of the compound A1 contained in the barrier layer A described above. Whether or not the component same as the compound A1 is contained can be confirmed by measuring a portion corresponding to the light absorption anisotropic film B in a cross-section of the laminate by TOF-SIMS under the above-described measurement conditions.

In the present invention, since the improving effect of the adhesiveness between the barrier layer A and the light absorption anisotropic film B becomes more apparent, the visibility-corrected alignment degree of the light absorption anisotropic film B is preferably 0.90 or greater, more preferably 0.92 or greater, and even more preferably 0.94 or greater.

Here, regarding the "visibility-corrected alignment degree", a light source, a linear polarizer, a transparent support, and a light absorption anisotropic film B provided on the support are installed in this order, a transmittance of light in a wavelength region of 380 to 780 nm incident from the transparent support side is measured, an alignment degree is calculated for each wavelength through the following formula and multiplied by a color correction factor, and an average thereof is calculated and defined as the visibility-corrected alignment degree.

Alignment Degree: $S = (A(\text{absorption}) - A(\text{transmission}))/[2 \times A(\text{transmission}) + A(\text{absorption})]$ A (absorption): absorbance in a state in which the incident polarized light and the light absorption anisotropic film B are arranged in crossed nicols A (transmission): absorbance in a state in which the incident polarized light and the light absorption anisotropic film B are arranged in para-Nicol $$A(\text{absorption}) = -\log_{10}(T(\text{absorption})/100)$$

$$A(\text{transmission}) = -\log_{10}(T(\text{transmission})/100)$$

T (absorption): transmittance in a state in which the incident polarized light and the light absorption anisotropic film B are arranged in crossed nicols (the incident polarized light is 100%)

T (transmission): transmittance in a state in which the incident polarized light and the light absorption anisotropic film B are arranged in para-Nicol (the incident polarized light is 100%)

<Compound B1>

In the present invention, from the viewpoint of increasing the alignment degree of the light absorption anisotropic film B, the highest content of the compound B1 contained in the light absorption anisotropic film B is preferably a compound represented by Formula (1) or a polymer thereof.

$$Q^1\text{-}D^1\text{-}G^1\text{-}D^2\text{-}G^2\text{-}D^3\text{-}Q^2 \tag{1}$$

In Formula (1), $Q^1$ and $Q^2$ each independently represent a hydrogen atom or a monovalent organic group, and at least one of $Q^1$ or $Q^2$ represents a polymerizable group.

In Formula (1), $D^1$, $D^2$, and D each independently represent a single bond, or a divalent linking group which is —(C=O)O—, —O(C=O)—, a substituted or unsubstituted alkylene group having 1 to 20 carbon atoms, a substituted or unsubstituted arylene group having 6 to 40 carbon atoms, a substituted or unsubstituted heteroarylene group having 4 to 30 carbon atoms, a substituted or unsubstituted cycloalkylene group having 6 to 40 carbon atoms, or in which one or more of —CH$_2$— moieties forming the above groups are substituted by —O—, —S—, —NR—, or —PR—, and R represents a hydrogen atom or an alkyl group having 1 to 20 carbon atoms.

In Formula (1), $G^1$ and $G^2$ each independently represent a substituted or unsubstituted arylene group having 6 to 40 carbon atoms, a substituted or unsubstituted heteroarylene group having 4 to 30 carbon atoms, or a substituted or unsubstituted cycloalkylene group having 6 to 40 carbon atoms.

Examples of the monovalent organic group represented by $Q^1$ and $Q^2$ in Formula (1) include an alkyl group, an aryl group, and a heteroaryl group.

The alkyl group may be linear, branched or cyclic, and is preferably linear. The number of carbon atoms of the alkyl group is preferably 1 to 30, more preferably 1 to 20, and even more preferably 1 to 10.

The aryl group may be monocyclic or polycyclic, and is preferably a monocyclic ring. The number of carbon atoms of the aryl group is preferably 6 to 25, and more preferably 6 to 10.

The heteroaryl group may be monocyclic or polycyclic. The number of hetero atoms of the heteroaryl group is preferably 1 to 3. The hetero atom of the heteroaryl group is preferably a nitrogen atom, a sulfur atom, or an oxygen atom. The number of carbon atoms of the heteroaryl group is preferably 6 to 18, and more preferably 6 to 12.

The alkyl group, the aryl group, and the heteroaryl group may be unsubstituted or may have a substituent.

Examples of the substituent include an alkyl group, an alkoxy group, and a halogen atom.

The alkyl group is, for example, preferably a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group), even more preferably an alkyl group having 1 to 4 carbon atoms, and particularly preferably a methyl group or an ethyl group.

The alkoxy group is, for example, preferably an alkoxy group having 1 to 18 carbon atoms, more preferably an alkoxy group having 1 to 8 carbon atoms (for example, a methoxy group, an ethoxy group, an n-butoxy group, and a methoxyethoxy group), even more preferably an alkoxy group having 1 to 4 carbon atoms, and particularly preferably a methoxy group or an ethoxy group.

Examples of the halogen atom include a fluorine atom, a chlorine atom, a bromine atom, and an iodine atom, and among these, a fluorine atom and a chlorine atom are preferable.

In Formula (1), the polymerizable group represented by at least one of $Q^1$ or $Q^2$ is not particularly limited, and is preferably a polymerizable group capable of radical polymerization or cationic polymerization.

In a case where the polymerizable group is a radically polymerizable group, a generally known radically polymerizable group can be used, and preferable examples thereof include an acryloyl group and a methacryloyl group. In this case, an acryloyl group generally has been known to have a high polymerization rate, and from the viewpoint of improving productivity, an acryloyl group is preferable. A methacryloyl group can also be similarly used as the polymerizable group.

In a case where the polymerizable group is a cationically polymerizable group, a generally known cationically polymerizable group can be used, and specific examples thereof include an alicyclic ether group, a cyclic acetal group, a cyclic lactone group, a cyclic thioether group, a spiro ortho ester group, and a vinyloxy group. Among these, an alicyclic ether group or a vinyloxy group is preferable, and an epoxy group, an oxetanyl group, or a vinyloxy group is particularly preferable.

Particularly preferable examples of the polymerizable group are as follows.

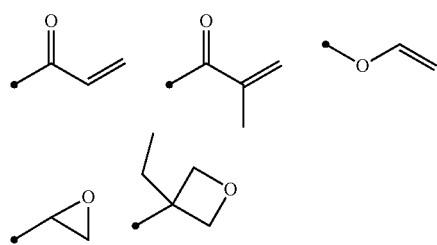

Examples of the substituted or unsubstituted alkylene group having 1 to 20 carbon atoms represented by $D^1$, $D^2$, and $D^3$ in Formula (1) include a linear or branched alkylene group having 1 to 12 carbon atoms. Specific examples thereof include a methylene group, an ethylene group, a propylene group, a butylene group, a pentylene group, a hexylene group, a methylhexylene group, and a heptylene group.

Examples of the substituent for substitution include a substituent same as the optional substituent of the alkyl group exemplified as the monovalent organic group represented by $Q^1$ and $Q^2$ in Formula (1).

Examples of the substituted or unsubstituted arylene group having 6 to 40 carbon atoms represented by $D^1$, $D^2$, and $D^3$ in Formula (1) include an arylene group having 6 to 12 carbon atoms. Specific examples thereof include a phenylene group, a cumenylene group, a mesitylene group, a tolylene group, and a xylylene group. Among these, a phenylene group is preferable.

Examples of the substituent for substitution include a substituent same as the optional substituent of the alkyl group exemplified as the monovalent organic group represented by $Q^1$ and $Q^2$ in Formula (1).

Examples of the substituted or unsubstituted heteroarylene group having 4 to 30 carbon atoms represented by $D^1$, $D^2$, and $D^3$ in Formula (1) include a 5-membered heterocyclic ring and a 6-membered heterocyclic ring. Specific examples of the 5-membered heterocyclic ring include an oxol ring, a thiol ring, an azole ring, an imidazole ring, a pyrazole ring, an oxazole ring, an isoxazole ring, a thiazole ring, and an isothiazole ring, and specific examples of the 6-membered heterocyclic ring include a triazine ring, a pyrazine ring, and a pyridine ring. Examples of the substituent for substitution include a substituent same as the optional substituent of the alkyl group exemplified as the monovalent organic group represented by $Q^1$ and $Q^2$ in Formula (1).

Examples of the substituted or unsubstituted cycloalkylene group having 6 to 40 carbon atoms represented by $D^1$, $D^2$, and $D^3$ in Formula (1) include a cycloalkane ring. Specific examples thereof include a cyclohexane ring, a cyclopeptane ring, a cyclooctane ring, a cyclododecane ring, and a cyclodocosane ring.

Examples of the substituent for substitution include a substituent same as the optional substituent of the alkyl group exemplified as the monovalent organic group represented by $Q^1$ and $Q^2$ in Formula (1).

Examples of the substituted or unsubstituted arylene group having 6 to 40 carbon atoms, the substituted or unsubstituted heteroarylene group having 4 to 30 carbon atoms, and the substituted or unsubstituted cycloalkylene group having 6 to 40 carbon atoms, represented by $G^1$ and $G^2$ in Formula (1), include those exemplified as the arylene group, the heteroarylene group, and the cycloalkylene group represented by $D^1$, $D^2$, and $D^3$ in Formula (1), respectively.

Preferable examples of the polymer of the compound represented by Formula (1) include a polymer liquid crystalline compound having a repeating unit represented by Formula (1-1) (hereinafter, also referred to as "repeating unit (1-1)").

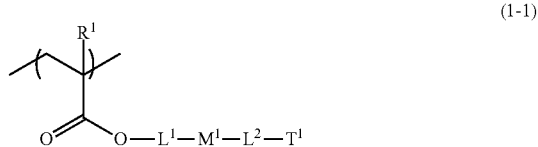

(1-1)

In Formula (1-1), $R^1$ represents a hydrogen atom or a methyl group, $L^1$ and $L^2$ each independently represent a single bond or a divalent linking group, $M^1$ represents a mesogenic group represented by Formula (1-1m) to be described later, and T represents a terminal group.

The divalent linking group represented by $L^1$ and $L^2$ in Formula (1-1) will be described. Examples of the divalent linking group include an alkylene group having 1 to 30 carbon atoms, in which one or more —$CH_2$— moieties of the alkylene group may be substituted by —O—, —($CH_2$)—, —($CF_2$)$_n$—, —Si($CH_2$)$_n$—, —(Si($CH_3$)$_2$O)$_n$—, —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')—, —C≡C—, —N=N—, —S—, —S(O)—, —S(O)(O)—, —(O)S(O)O—, —O(O)S(O)O—, —SC(O)—, or —C(O)S—. n represents an integer of 1 to 3, and Z, Z' and Z" each independently represent a hydrogen atom, an alkyl group having 1 to 4 carbon atoms, a cycloalkyl group, an aryl group, a cyano group, or a halogen atom.

Specific examples of the alkylene group having 1 to 30 carbon atoms include an ethylene group, a propylene group, a butylene group, a pentylene group, a hexylene group, a heptylene group, an octylene group, a nonylene group, a decylene group, an undecylene group, a dodecylene group, a tridecylene group, a tetradecylene group, a pentadecylene group, a hexadecylene group, a heptadecylene group, and an octadecylene group.

The alkylene group preferably has 1 to 12 carbon atoms.

In the present invention, $L^1$ in Formula (1-1) is preferably an oxyalkylene structure in which one or more —$CH_2$— moieties of the above-described alkylene group is substituted by —O—.

Examples of the oxyalkylene structure include an oxyethylene structure represented by *—($CH_2$—$CH_2$O)$_{n1}$—*, an oxypropylene structure represented by *—($CH_2$—$CH_2$—$CH_2$O)$_2$—* or *—(CH($CH_3$)—$CH_2$O)$_{n2}$—*, and an oxybutylene structure represented by *—($CH_2$—$CH_2$—$CH_2$—$CH_2$O)$_{n3}$—*. n1, n2, and n3 each independently represent an integer of 1 to 20, and * represents a bonding position to the oxygen atom in Formula (1) or $M^1$.

$L^2$ in Formula (1-1) is preferably a single bond.

Next, the terminal group represented by $T^1$ in Formula (1-1) will be described.

Specific examples of the terminal group include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an oxycarbonyl group having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, and a ureido group having 1 to 10 carbon atoms. The terminal groups may be further substituted by the above groups or a polymerizable group described in JP2010-244038A.

Next, $M^1$ in Formula (1-1), that is, the mesogenic group represented by Formula (1-1m) will be described.

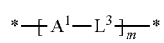

(1-1m)

In Formula (1-1m), $A^1$ represents a divalent group selected from the group consisting of an aromatic hydrocarbon group, a heterocyclic group, and an alicyclic group which may have a substituent, L represents a single bond or a divalent linking group, m represents an integer of 1 to 10, and * represents a bonding position to $L^1$ or $L^2$. In a case where m is an integer of 2 to 10, a plurality of $A^1$'s may be the same or different, and a plurality of $L^3$'s may be the same or different.

The divalent group represented by $A^1$ is preferably a 4- to 6-membered ring.

Furthermore, the divalent group represented by $A^1$ may be a monocyclic ring or a condensed ring.

Examples of the substituent that $A^1$ may have include an alkyl group, a fluorinated alkyl group, and an alkoxy group.

Examples of the divalent aromatic hydrocarbon group represented by $A^1$ include a phenylene group, a naphthylene group, a fluorene-diyl group, an anthracene-diyl group, and a tetracene-diyl group, and from the viewpoint of diversity in design of the mesogenic skeleton, availability of raw materials, and the like, a phenylene group or a naphthylene group is preferable, and a phenylene group is more preferable.

The divalent heterocyclic group represented by $A^1$ may be either aromatic or non-aromatic, and is preferably a divalent aromatic heterocyclic group from the viewpoint of a further improvement in the alignment degree.

Examples of the atom other than the carbon atom of the divalent aromatic heterocyclic group include a nitrogen atom, a sulfur atom, and an oxygen atom. In a case where the aromatic heterocyclic group has a plurality of ring-constituent atoms other than the carbon atom, these may be the same or different Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by $A^1$ include a cyclopentylene group and a cyclohexylene group.

Examples of the divalent linking group represented by $L^3$ include —O—, —($CH_2$)$_g$—, —($CF_2$)$_g$—, —Si($CH_3$)$_2$—, —(Si($CH_3$)$_2$O)$_g$—, —(OSi($CH_3$)$_2$)$_g$—, —N(Z)—, —C(Z)=C(Z')—, —C(Z)=N—, —N—C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)—C(Z')—, —C(Z)=N—N=C(Z')—, —C≡C—, —N—N—, —S—, —S(O)—, —S(O)(O)—, —(O)S(O)O—, —O(O)S(O)O—, —SC(O)—, and —C(O)S—, and may also include a group obtained by combining two or more of the above groups. g represents an integer of 1 to 10, and Z, Z' and Z" each independently represent a hydrogen atom, an alkyl group having 1 to 4 carbon atoms, a cycloalkyl group, an aryl group, a cyano group, or a halogen atom.

Specific examples of $M^1$ include the following structures. In the following specific examples, "Ac" represents an acetyl group.

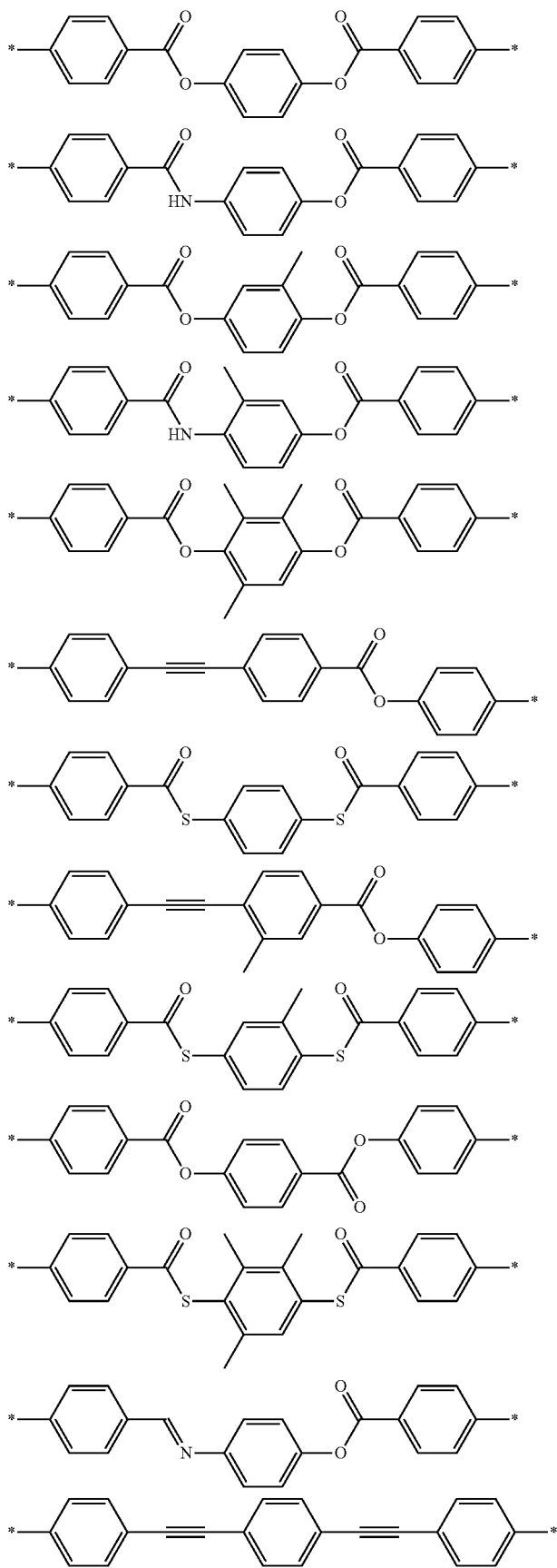

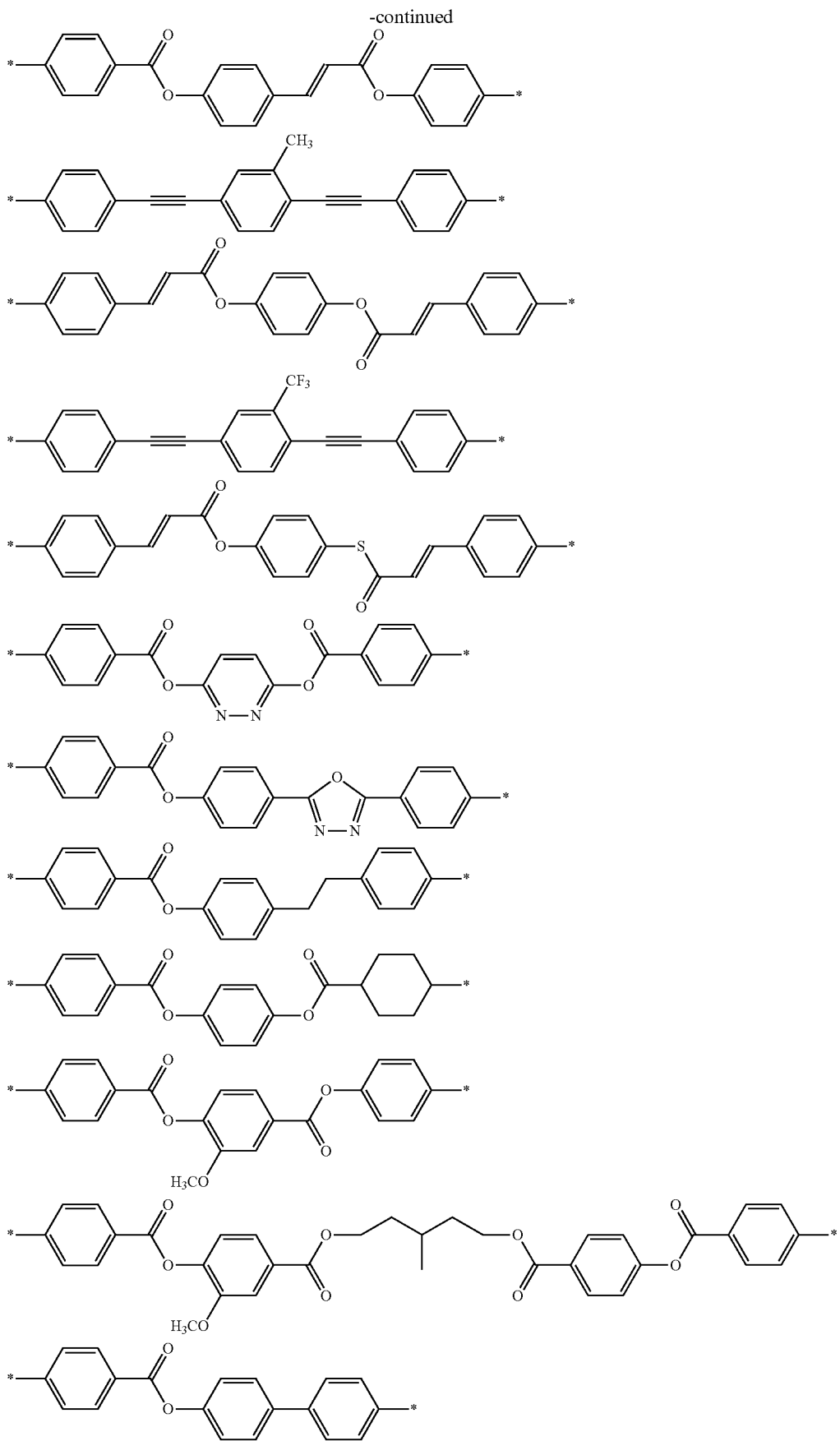

-continued
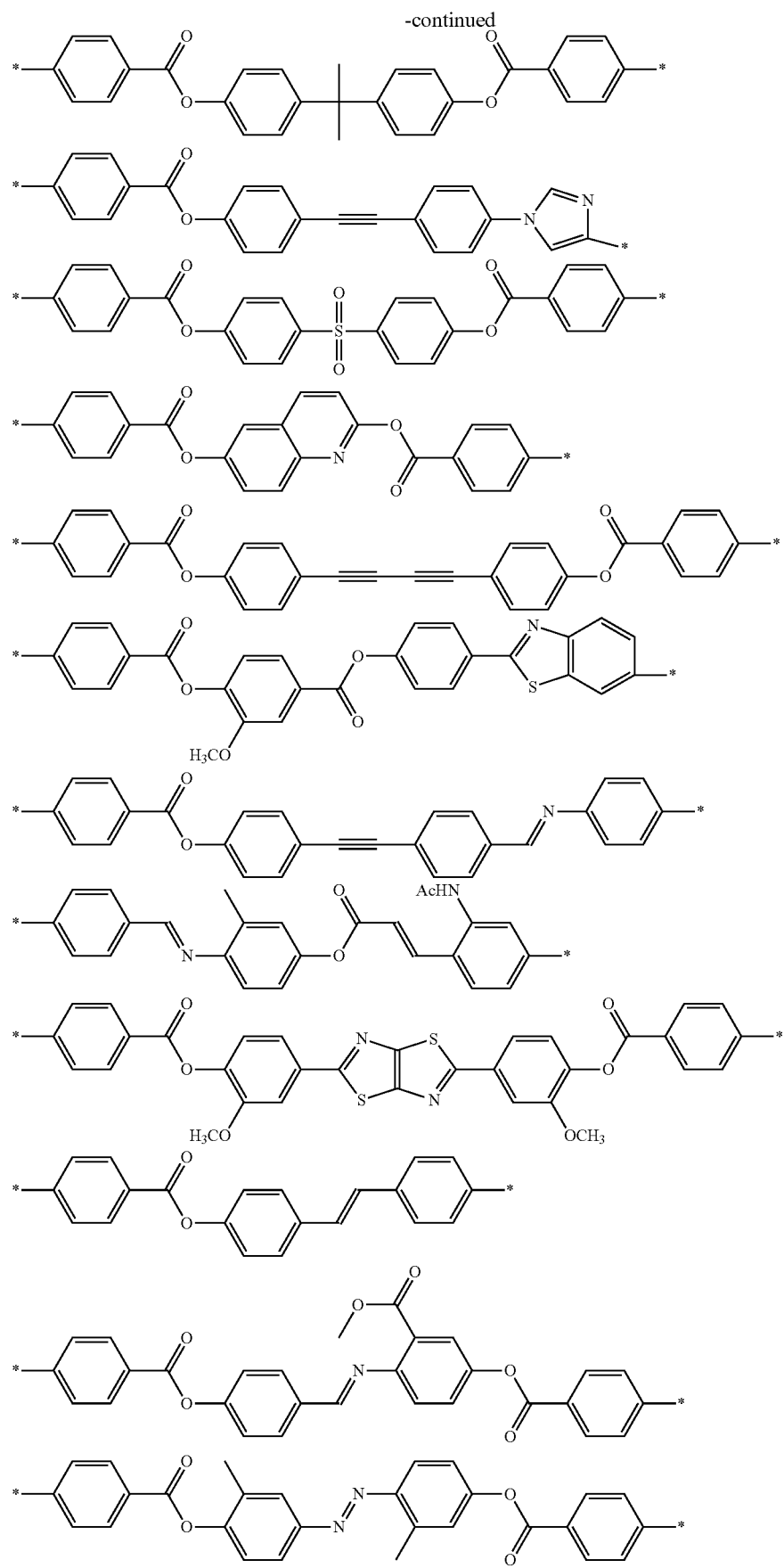

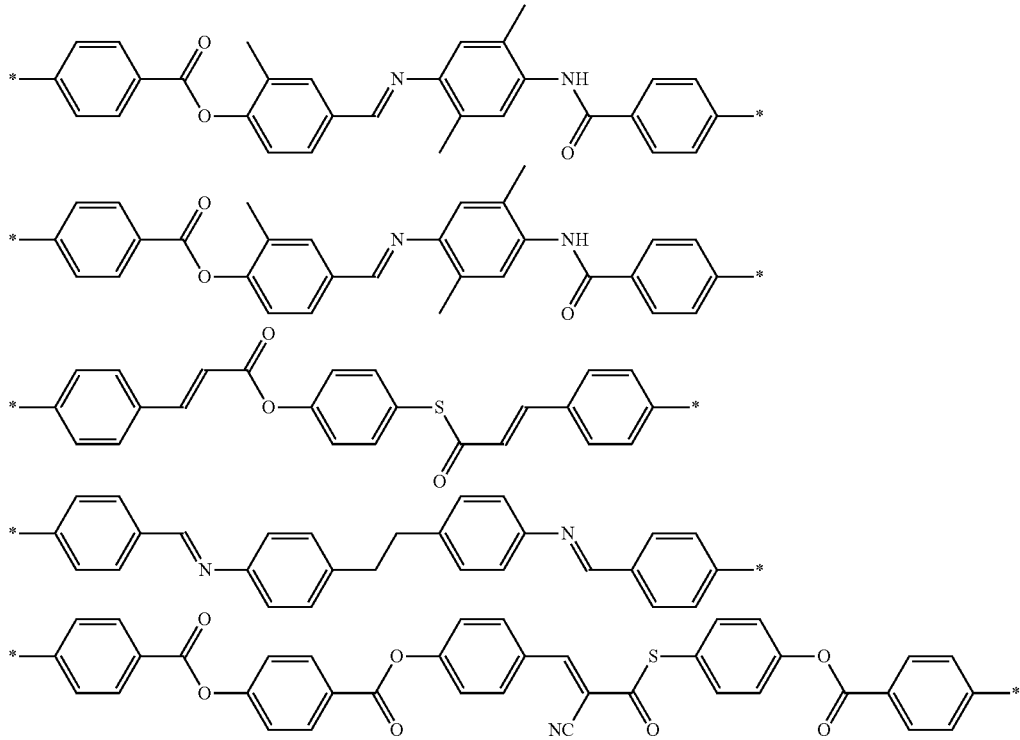
Specific examples of the polymer liquid crystalline compound having the repeating unit (1-1) include polymer compounds represented by the following structural formulae. In the following structural formulae, R represents a hydrogen atom or a methyl group.
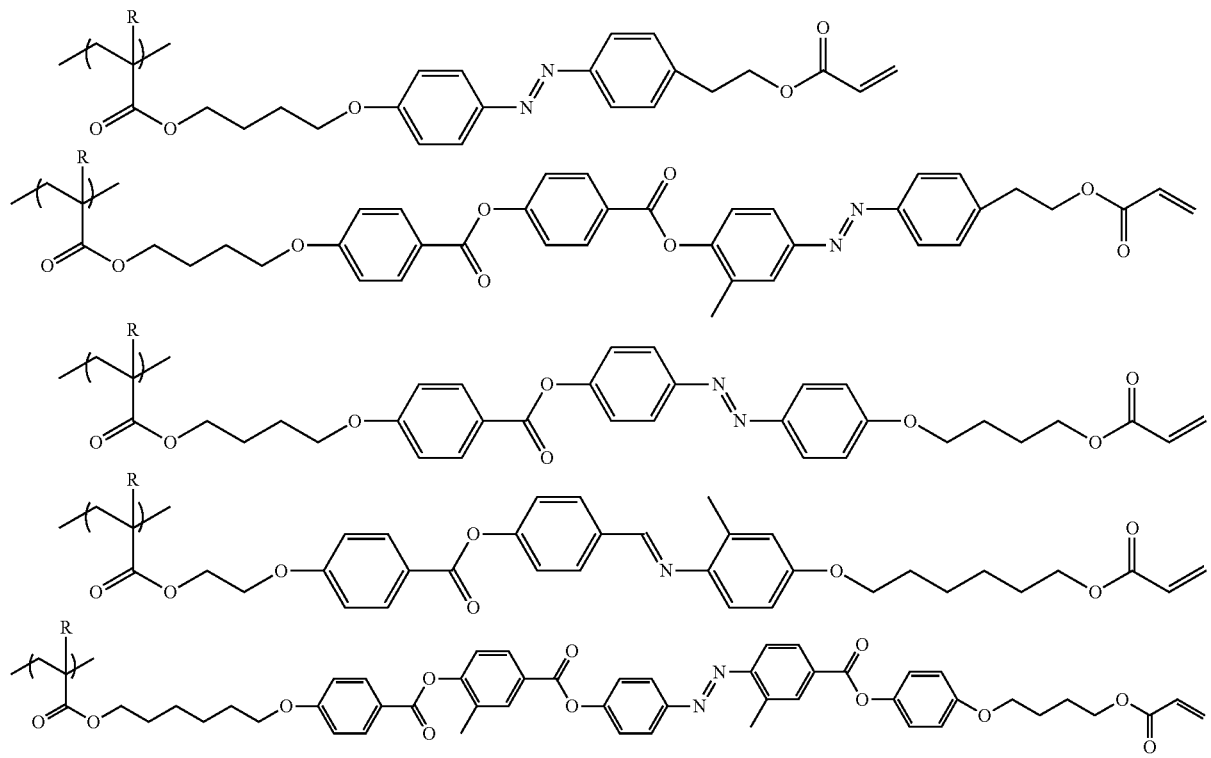

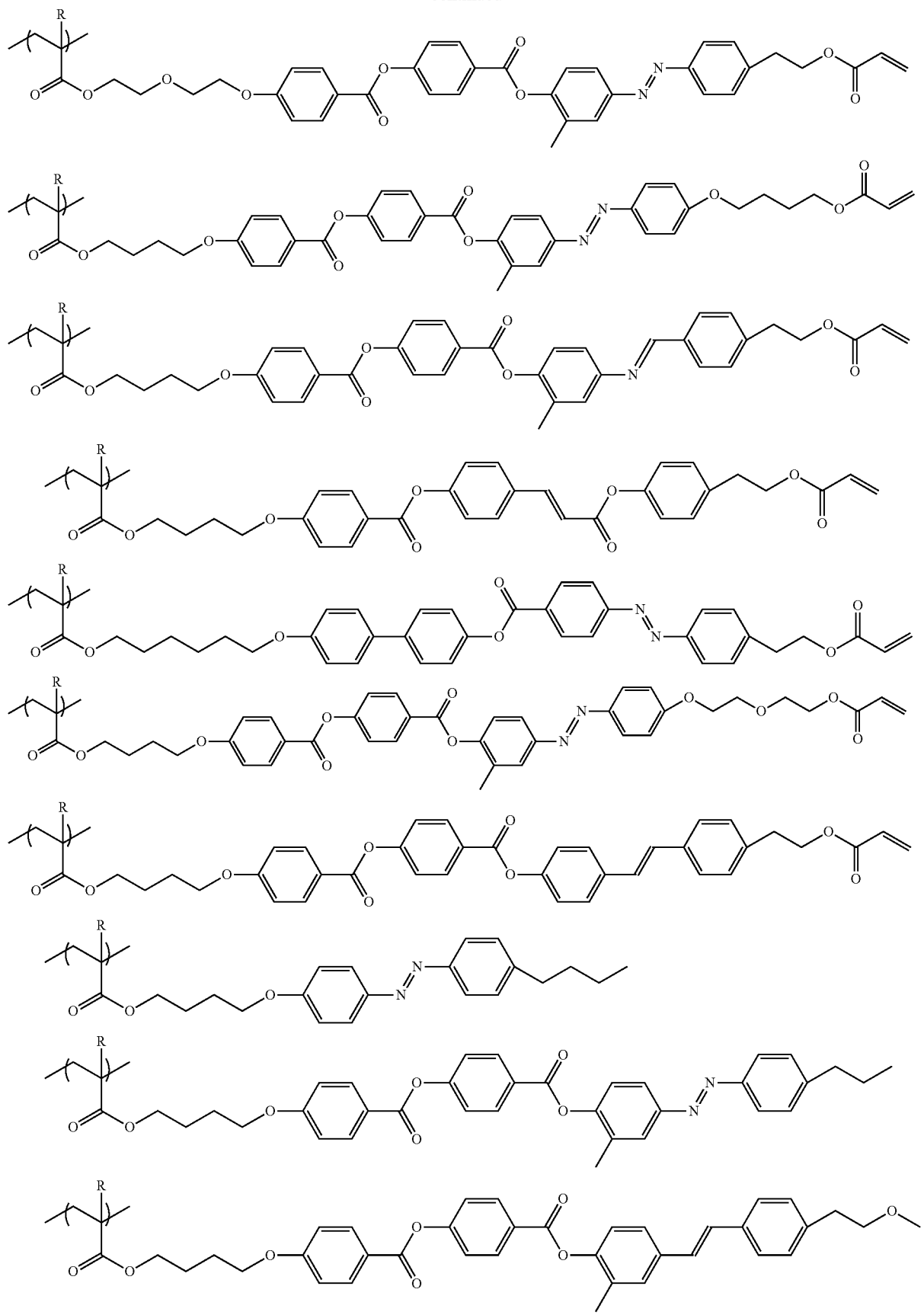

-continued
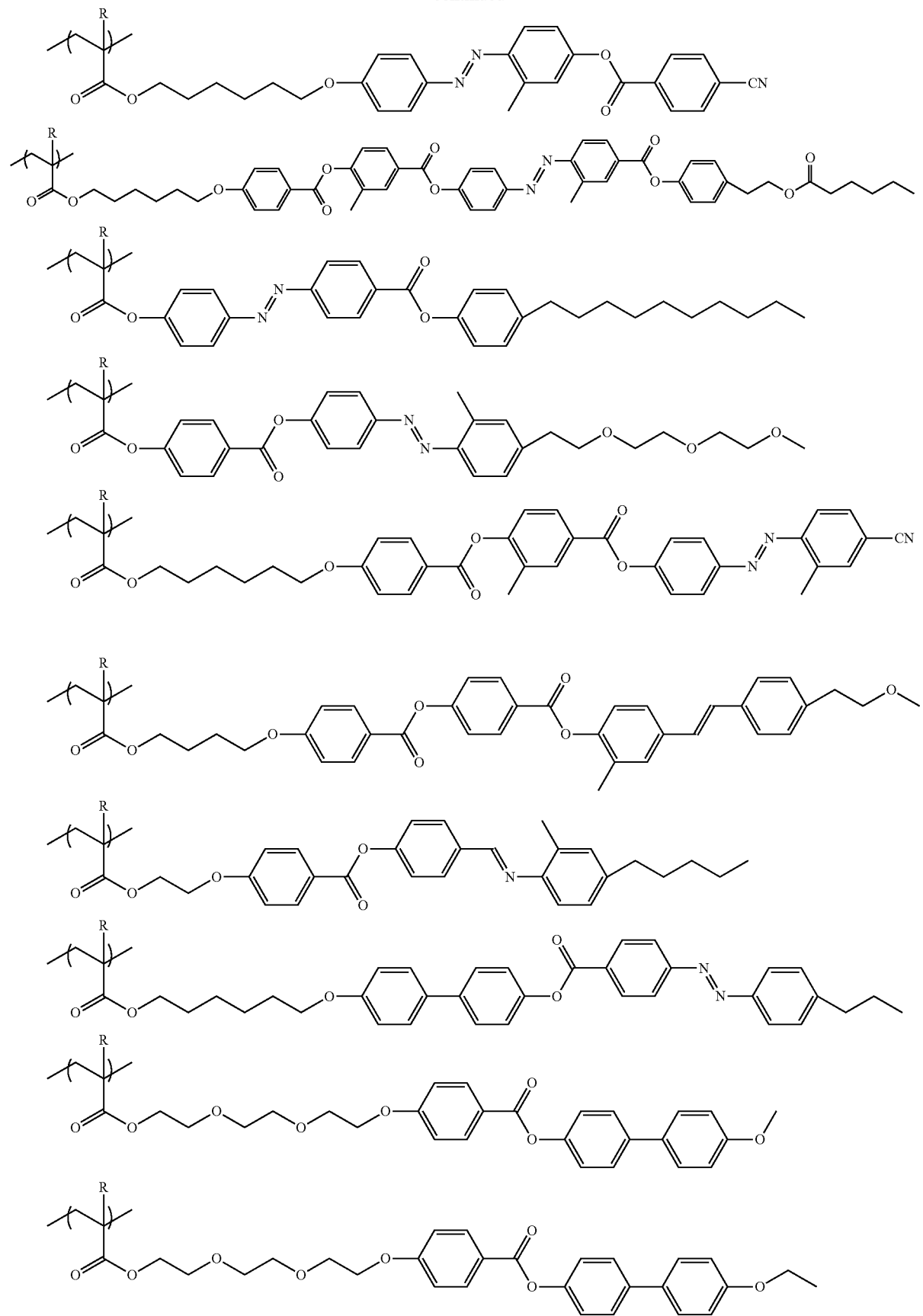

-continued
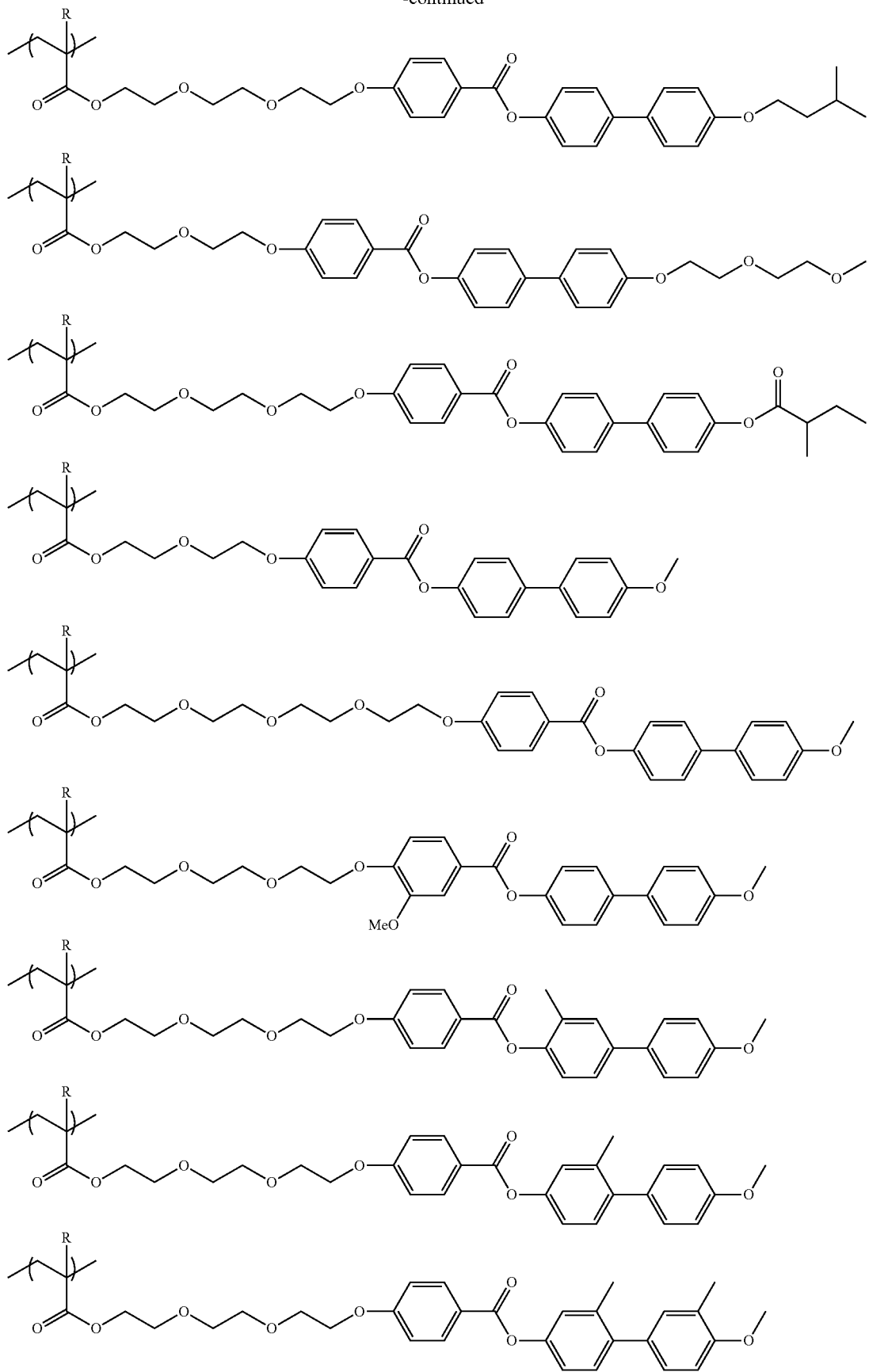

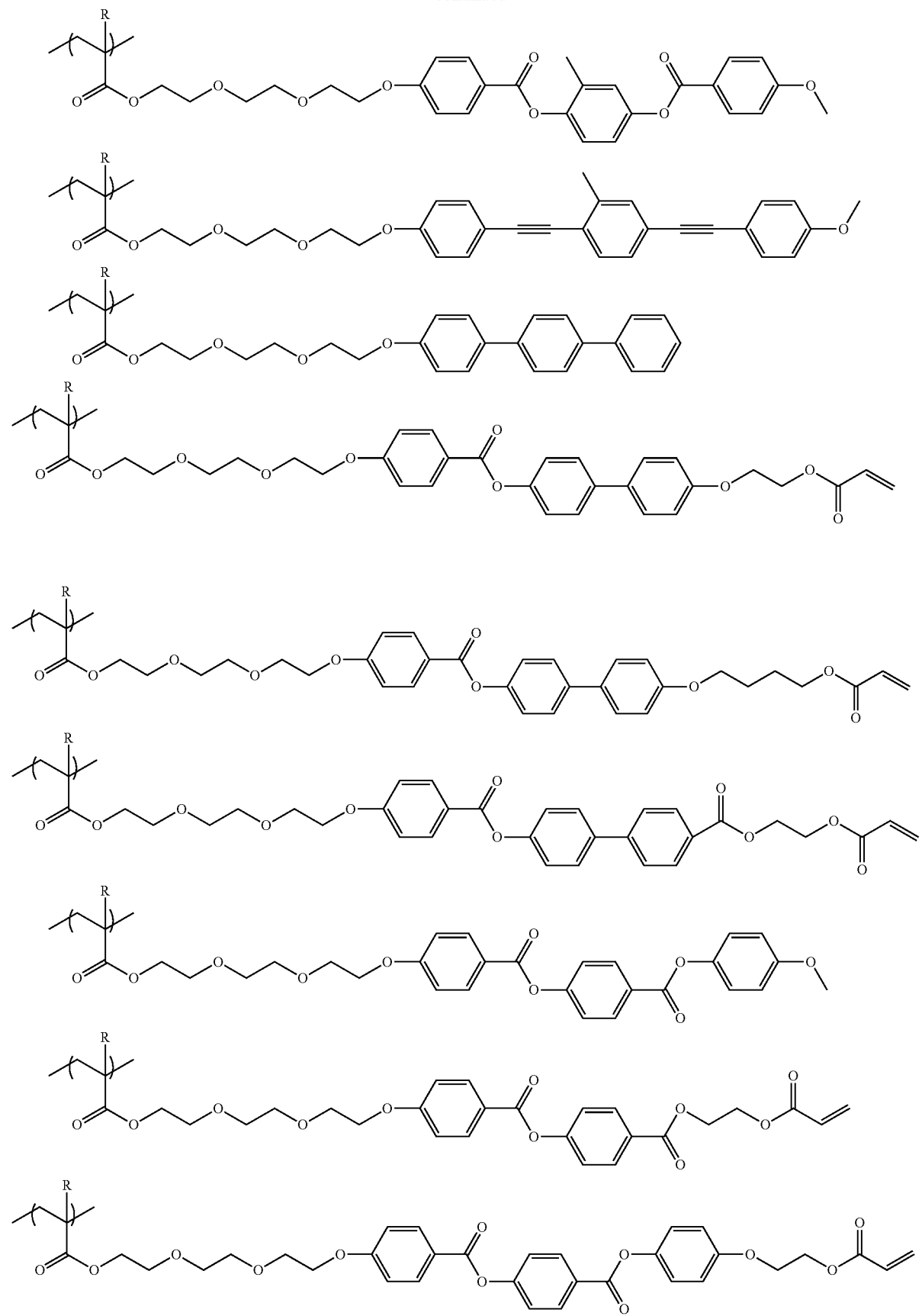

-continued

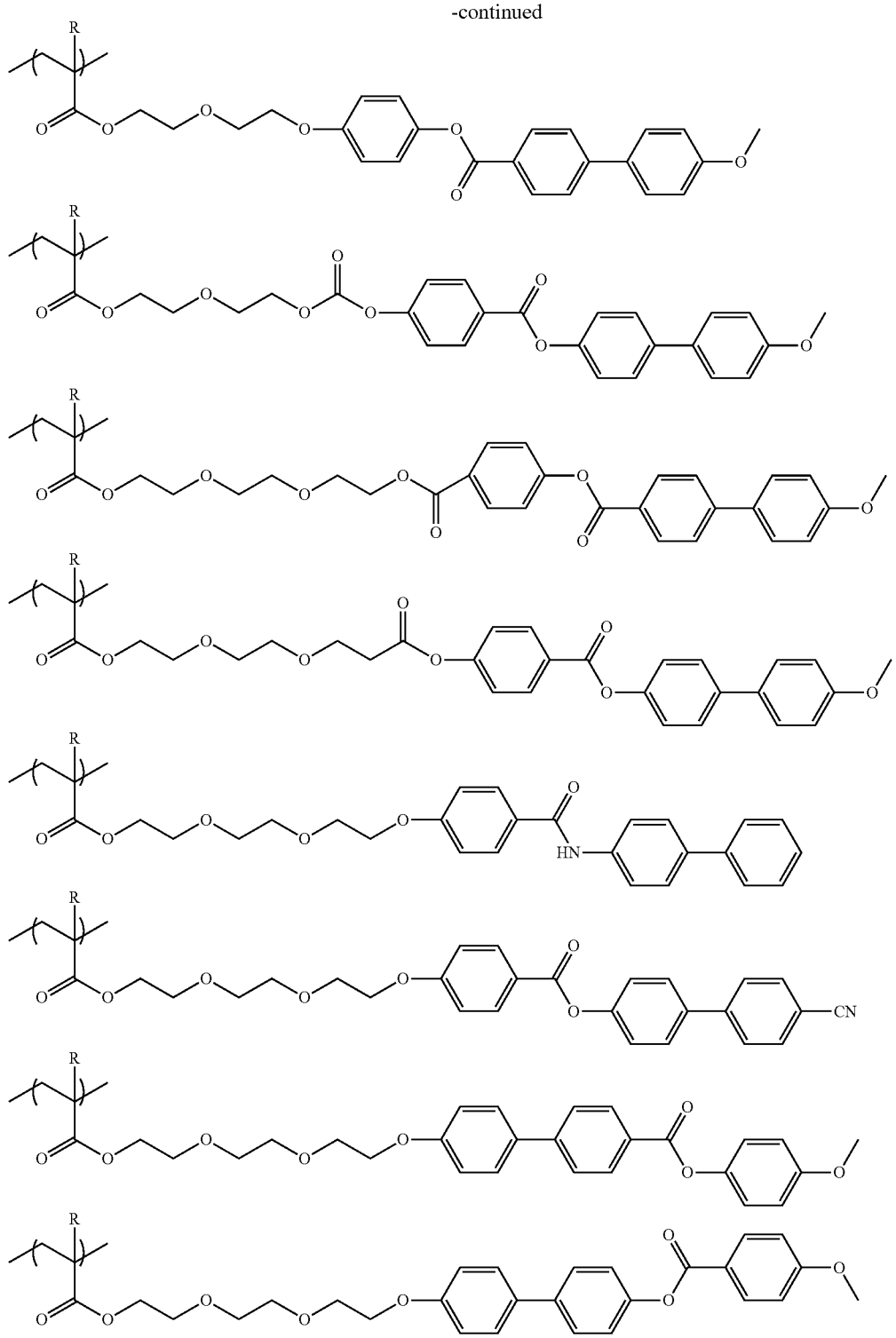

In a case where the polymer liquid crystalline compound has the repeating unit (1-1), the content of the repeating unit (1-1) is preferably 20 to 100 mass %, more preferably 30 to 99.9 mass %, and even more preferably 40 to 99.0 mass % with respect to 100 mass % of all the repeating units of the polymer liquid crystalline compound.

In the present invention, the content of each repeating unit contained in the polymer liquid crystalline compound is calculated based on the amount (mass) of each monomer used for obtaining each repeating unit.

The repeating unit (1-1) may be contained alone or in combination of two or more kinds thereof in the polymer liquid crystalline compound. In a case where the polymer liquid crystalline compound contains two or more kinds of repeating units (1-1), there are advantages in that the solubility of the polymer liquid crystalline compound in a solvent is improved, and the liquid crystal phase transition temperature is easily adjusted. In a case where two or more kinds of repeating units (1-1) are contained, the total content thereof is preferably within the above range.

In a case where two or more kinds of repeating units (1-1) are contained, a repeating unit (1a) having no polymerizable group in $T^1$ and a repeating unit (1b) having a polymerizable group in $T^1$ may be used in combination. Accordingly, the curability of the light absorption anisotropic film B is further improved.

In this case, a ratio of the repeating unit (1b) containing a polymerizable group in $T^1$ to the repeating unit (1a) containing no polymerizable group in $T^1$ in the polymer liquid crystalline compound (repeating unit (1b) containing polymerizable group in $T^1$/repeating unit (1a) containing no polymerizable group in $T^1$) is preferably 0.005 to 4, and more preferably 0.01 to 2.4 in terms of mass ratio. In a case where the mass ratio is 4 or less, there is an advantage in that the alignment degree of the light absorption anisotropic film B is further improved. In a case where the mass ratio is 0.05 or greater, the curability of the light absorption anisotropic film B is further improved.

Furthermore, from the viewpoint of adjusting the solubility of the polymer liquid crystalline compound in the solvent and the liquid crystal phase transition temperature, the polymer liquid crystalline compound may have a repeating unit (hereinafter, abbreviated as "repeating unit (1-2)") other than the repeating unit (1-1).

Here, examples of the repeating unit (1-2) include a repeating unit same as the above-described repeating unit (1-1), except that no mesogenic group is contained.

In a case where the polymer liquid crystalline compound has the repeating unit (1-2), the polymer liquid crystalline compound is a copolymer of the repeating unit (1-1) and the repeating unit (1-2), and may be any polymer such as a block polymer, an alternating polymer, a random polymer, and a graft polymer.

In a case where the polymer liquid crystalline compound contains the repeating unit (1-2), the content of the repeating unit (1-2) is preferably 0.5 to 40 mass %, and more preferably 1 to 30 mass % with respect to 100 mass % of all the repeating units of the polymer liquid crystalline compound.

The repeating unit (1-2) may be contained alone or in combination of two or more kinds thereof in the polymer liquid crystalline compound. In a case where two or more kinds of repeating units (1-2) are contained, the total content thereof is preferably within the above range.

The weight-average molecular weight (Mw) of the polymer liquid crystalline compound is preferably 2,000 to 300,000, and more preferably 2,000 to 100,000. In a case where Mw of the polymer liquid crystalline compound is within the above range, handling of the polymer liquid crystalline compound is facilitated.

Here, in the present invention, the weight-average molecular weight and the number-average molecular weight are values measured by gel permeation chromatography (GPC).

Solvent (eluent): N-methylpyrrolidone
Device Name: TOSOH HLC-8220GPC
Column: Three items of TOSOH TSKgel Super HZM-H (4.6 mm×15 cm) are connected and used.
Column Temperature: 25° C.
Sample Concentration: 0.1 mass %
Flow Rate: 0.35 ml/min
Calibration Curve: A calibration curve obtained from 7 samples of TSK Standard Polystyrene manufactured by TOSOH corporation, of which Mw=2,800,000 to 1,050 (Mw/Mn=1.03 to 1.06), is used.

The polymer liquid crystalline compound may exhibit any one of nematic liquid crystallinity or smectic liquid crystallinity, and preferably exhibits at least nematic liquid crystallinity.

The temperature range at which the nematic phase is exhibited is preferably room temperature (23° C.) to 400° C., and from the viewpoint of handling and manufacturing suitability, preferably 50° C. to 300° C.

In the present invention, the content of the compound B1 in the light absorption anisotropic film B is preferably 50 to 100 mass %, and more preferably 60 to 99 mass %. Here, the content of the compound B1 can be calculated as follows: the laminate according to the embodiment of the present invention is obliquely cut at an angle of 1° with respect to the surface of the laminate, and a portion corresponding to the light absorption anisotropic film B in the formed cross-section is subjected to mapping measurement by TOF-SIMS to calculate the content of the compound B1 from a peak intensity ratio of the fragment ion detected specifically. Specifically, it can be confirmed by TOF-SIMS under the same measurement conditions as those used in the measurement of the content of the compound A1 by TOF-SIMS.

In addition, the content of the compound B1 can be measured and calculated in the same manner after exposure of the light absorption anisotropic film B by etching.

In the present invention, the light absorption anisotropic film B is preferably a film formed using a composition (hereinafter, abbreviated as "liquid crystal composition") containing the compound B1 (particularly, the above-described polymer liquid crystalline compound) and the dichroic substance.

<Dichroic Substance>

The dichroic substance is not particularly limited, and examples thereof include a visible light absorbing substance (dichroic dye), a luminescent substance (fluorescent substance, phosphorescent substance), an ultraviolet absorbing substance, an infrared absorbing substance, a non-linear optical substance, a carbon nanotube, and an inorganic substance (for example, a quantum rod). A conventionally known dichroic substance (dichroic dye) can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, or paragraphs [0013] to [0037] of WO2017/195833A.

In the present invention, the dichroic substance is preferably a dichroic substance represented by Formula (2) (hereinafter, also abbreviated as "specific dichroic dye compound").

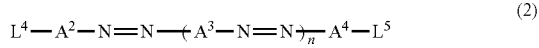

(2)

Here, in Formula (2), $A^2$, $A^3$, and $A^4$ each independently represent a divalent aromatic group which may have a substituent.

In Formula (2), $L^4$ and $L^5$ each independently represent a substituent.

In Formula (2), n represents an integer of 1 to 4, and in a case where n is an integer of 2 to 4, a plurality of $A^3$'s may be the same or different. n is preferably 1 or 2.

The "divalent aromatic group which may have a substituent" represented by $A^2$, $A^3$, and $A^4$ in Formula (2) will be described.

Examples of the substituent include the substituent group G described in paragraphs [0237] to [0240] of JP2011-237513A. Among these, a halogen atom, an alkyl group, an alkoxy group, an alkoxycarbonyl group (for example, methoxycarbonyl and ethoxycarbonyl), an aryloxycarbonyl group (for example, phenoxycarbonyl, 4-methylphenoxycarbonyl, and 4-methoxyphenylcarbonyl), and the like are preferable, an alkyl group is more preferable, and an alkyl group having 1 to 5 carbon atoms is even more preferable.

Examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

The divalent aromatic heterocyclic group is preferably a monocyclic or bicyclic heterocyclic ring-derived group. Examples of atoms other than carbon of the aromatic heterocyclic group include a nitrogen atom, a sulfur atom, and an oxygen atom. In a case where the aromatic heterocyclic group has a plurality of ring-constituent atoms other than the carbon atom, these may be the same or different. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimide-diyl group, and a thienothiazole-diyl group (hereinafter, abbreviated as "thienothiazole group").

Among the divalent aromatic groups, a divalent aromatic hydrocarbon group is preferable.

Here, any one of $A^2$, $A^3$, or $A^4$ is preferably a divalent thienothiazole group which may have a substituent. Specific examples and preferable aspects of the substituent of the divalent thienothiazole group are the same as those of the substituent in the "divalent aromatic group which may have a substituent".

It is more preferable that among $A^2$, $A^3$, and $A^4$, $A^3$ is a divalent thienothiazole group. In this case, $A^2$ and $A^4$ represent a divalent aromatic group which may have a substituent.

In a case where $A^3$ is a divalent thienothiazole group, it is preferable that at least one of $A^2$ or $A^4$ is a divalent aromatic hydrocarbon group which may have a substituent, and it is more preferable that both $A^2$ and $A^4$ are divalent aromatic hydrocarbon groups which may have a substituent.

In Formula (2), the "substituent" represented by $L^4$ and $L^5$ will be described. As the substituent, a group having a group introduced to increase solubility or nematic liquid crystallinity, a group introduced to adjust a tone as a dye and having an electron-donating property or an electron-withdrawing property, or a crosslinking group (polymerizable group) introduced to fix the alignment is preferable.

Examples of the substituent include an alkyl group (an alkyl group preferably having 1 to 20 carbon atoms, more preferably 1 to 12 carbon atoms, and particularly preferably 1 to 8 carbon atoms, e.g., a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (an alkenyl group preferably having 2 to 20 carbon atoms, more preferably 2 to 12 carbon atoms, and particularly preferably 2 to 8 carbon atoms, e.g., a vinyl group, an aryl group, a 2-butenyl group, and a 3-pentenyl group), an alkynyl group (an alkynyl group preferably having 2 to 20 carbon atoms, more preferably 2 to 12 carbon atoms, and particularly preferably 2 to 8 carbon atoms, e.g., a propargyl group and a 3-pentynyl group), an aryl group (an aryl group preferably having 6 to 30 carbon atoms, more preferably 6 to 20 carbon atoms, and particularly preferably 6 to 12 carbon atoms, e.g., a phenyl group, a 2,6-diethylphenyl group, a 3,5-ditrifluoromethylphenyl group, a styryl group, a naphthyl group, and a biphenyl group), a substituted or unsubstituted amino group (an amino group preferably having 0 to 20 carbon atoms, more preferably 0 to 10 carbon atoms, and particularly preferably 0 to 6 carbon atoms, e.g., an unsubstituted amino group, a methylamino group, a dimethylamino group, a diethylamino group, and an anilino group), an alkoxy group (preferably having 1 to 20 carbon atoms, and more preferably 1 to 15 carbon atoms, e.g., a methoxy group, an ethoxy group, and a butoxy group), an oxycarbonyl group (preferably having 2 to 20 carbon atoms, more preferably 2 to 15 carbon atoms, and particularly preferably 2 to 10 carbon atoms, e.g., a methoxycarbonyl group, an ethoxycarbonyl group, and a phenoxycarbonyl group), an acyloxy group (preferably having 2 to 20 carbon atoms, more preferably 2 to 10 carbon atoms, and particularly preferably 2 to 6 carbon atoms, e.g., an acetoxy group, a benzoyloxy group, an acryloyl group, and a methacryloyl group), an acylamino group (preferably having 2 to 20 carbon atoms, more preferably 2 to 10 carbon atoms, and particularly preferably 2 to 6 carbon atoms, e.g., an acetylamino group and a benzoylamino group), an alkoxycarbonylamino group (preferably having 2 to 20 carbon atoms, more preferably 2 to 10 carbon atoms, and particularly preferably 2 to 6 carbon atoms, e.g., a methoxycarbonylamino group), an aryloxycarbonylamino group (preferably having 7 to 20 carbon atoms, more preferably 7 to 16 carbon atoms, and particularly preferably 7 to 12 carbon atoms, e.g., a phenyloxycarbonylamino group), a sulfonylamino group (preferably having 1 to 20 carbon atoms, more preferably 1 to 10 carbon atoms, and particularly preferably 1 to 6 carbon atoms, e.g., a methanesulfonylamino group and a benzenesulfonylamino group), a sulfamoyl group (preferably having 0 to 20 carbon atoms, more preferably 0 to 10 carbon atoms, and particularly preferably 0 to 6 carbon atoms, e.g., a sulfamoyl group, a methylsulfamoyl group, a dimethylsulfamoyl group, and a phenylsulfamoyl group), a carbamoyl group (preferably having 1 to 20 carbon atoms, more preferably 1 to 10 carbon atoms, and particularly preferably 1 to 6 carbon atoms, e.g., an unsubstituted carbamoyl group, a methylcarbamoyl group, a diethylcarbamoyl group, and a phenylcarbamoyl group), an alkylthio group (preferably having 1 to 20 carbon atoms, more preferably 1 to 10 carbon atoms, and particularly preferably 1 to 6 carbon atoms, e.g., a methylthio group and an ethylthio group), an arylthio group (preferably having 6 to 20 carbon atoms, more preferably 6 to 16 carbon atoms, and particularly preferably 6 to 12 carbon atoms, e.g., a phenylthio group), a sulfonyl group (preferably having 1 to 20 carbon atoms, more preferably 1 to 10 carbon atoms, and particularly preferably 1 to 6 carbon atoms, e.g., a mesyl group and a tosyl group), a sulfinyl group (preferably having 1 to 20 carbon atoms, more preferably 1 to 10 carbon atoms, and particularly preferably 1 to 6 carbon atoms, e.g., a methanesulfinyl group and a benzenesulfinyl group), a ureido group (preferably having 1 to 20 carbon atoms, more preferably 1 to 10 carbon atoms, and particularly preferably 1 to 6 carbon atoms, e.g., an unsubstituted ureido group, a methylureido group, and a phenylureido group), a phosphoric acid amide group (preferably having 1 to 20 carbon atoms, more preferably 1 to 10 carbon atoms, and particularly preferably 1 to 6 carbon atoms, e.g., a diethylphosphoric acid amide group and a phenylphosphoric acid amide group), a hydroxy group, a mercapto group, a halogen atom (for example, a fluorine atom, a chlorine atom, a bromine atom, and an iodine atom), a cyano group, a nitro group, a hydroxamic group, a sulfino group, a hydrazino group, an imino group, an azo group, a heterocyclic group (a heterocyclic group preferably having 1 to 30 carbon atoms, and more preferably 1 to 12 carbon atoms, e.g., a heterocyclic group having a hetero atom such as a nitrogen atom, an oxygen atom, or a sulfur atom, such as an epoxy group, an oxetanyl group, an imidazolyl group, a pyridyl group, a quinolyl group, a furyl group, a piperidyl group, a morpholino group, a benzoxazolyl group, a benzimidazolyl group, and a benzthiazolyl group), a silyl group (a silyl group preferably having 3 to 40 carbon atoms, more preferably 3 to 30 carbon atoms, and particularly preferably 3 to 24 carbon atoms, e.g., a trimethylsilyl group and a triphenylsilyl group).

These substituents may be further substituted by the above substituents. In a case where two or more substituents are provided, the substituents may be the same or different. The substituents may be bonded to each other to form a ring.

The substituent represented by $L^4$ and $L^5$ is preferably an alkyl group which may have a substituent, an alkenyl group which may have a substituent, an alkynyl group which may have a substituent, an aryl group which may have a substituent, an alkoxy group which may have a substituent, an oxycarbonyl group which may have a substituent, an acyloxy group which may have a substituent, an acylamino group which may have a substituent, an amino group which may have a substituent, an alkoxycarbonylamino group which may have a substituent, a sulfonylamino group which may have a substituent, a sulfamoyl group which may have a substituent, a carbamoyl group which may have a substituent, an alkylthio group which may have a substituent, a sulfonyl group which may have a substituent, a ureido group which may have a substituent, a nitro group, a hydroxy group, a cyano group, an imino group, an azo group, a halogen atom, or a heterocyclic group, and more preferably an alkyl group which may have a substituent, an alkenyl group which may have a substituent, an aryl group which may have a substituent, an alkoxy group which may have a substituent, an oxycarbonyl group which may have a substituent, an acyloxy group which may have a substituent, an amino group which may have a substituent, a nitro group, an imino group, or an azo group.

It is preferable that at least one of $L^4$ or $L^5$ contains a crosslinking group (polymerizable group), and it is more preferable that both $L^4$ and $L^5$ contain a crosslinking group.

Specific examples of the crosslinking group include the polymerizable groups described in paragraphs 0040 to 0050 of JP2010-244038A. From the viewpoint of reactivity and synthesis suitability, an acryloyl group, a methacryloyl group, an epoxy group, an oxetanyl group, and a styryl group are preferable, and an acryloyl group and a methacryloyl group are more preferable.

Examples of preferable aspects of $L^4$ and $L^5$ include an alkyl group substituted by the crosslinking group, a dialkylamino group substituted by the crosslinking group, and an alkoxy group substituted by the crosslinking group.

In the present invention, the specific dichroic dye compound preferably has a structure represented by Formula (3) since the alignment degree of the specific dichroic dye compound contained in the light absorption anisotropic film is further improved.

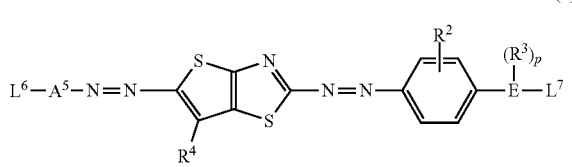

(3)

Here, in Formula (3), A represents a divalent aromatic group which may have a substituent.

In Formula (3), $L^6$ and $L^7$ each independently represent a substituent.

In Formula (3), E represents any one of a nitrogen atom, an oxygen atom, or a sulfur atom.

In Formula (3), $R^2$ represents any one of a hydrogen atom, a halogen atom, an alkyl group which may have a substituent, or an alkoxy group which may have a substituent.

In Formula (3), $R^3$ represents a hydrogen atom or an alkyl group which may have a substituent.

In Formula (3), $R^4$ represents a hydrogen atom or a substituent.

In Formula (3), p represents 0 or 1. In a case where E is a nitrogen atom, p is 1, and in a case where E is an oxygen atom or a sulfur atom, p is 0.

Specific examples and preferable aspects of the "divalent aromatic group which may have a substituent" represented by $A^5$ in Formula (3) are similar to those of the "divalent aromatic group which may have a substituent" represented by $A^1$ to $A^3$ in Formula (2).

A particularly preferable aspect of $A^5$ is a phenylene group.

Specific examples and preferable aspects of the "substituent" represented by L and L in Formula (3) are similar to those of the "substituent" represented by $L^1$ and $L^3$ in Formula (2).

A more preferable aspect of $L^6$ and L is that at least one of $L^6$ or $L^7$ contains a crosslinking group, and an even more preferable aspect thereof is that both $L^6$ and $L^7$ contain a crosslinking group. Accordingly, the alignment degree of the specific dichroic dye compound contained in the light absorption anisotropic film is further improved, and the high-temperature durability and the moisture-heat resistance of the laminate are improved.

A more preferable aspect of the crosslinking group of $L^6$ and $L^7$ is an acryloyl group or a methacryloyl group.

In Formula (3), E represents any one of a nitrogen atom, an oxygen atom, or a sulfur atom, and is preferably a nitrogen atom from the viewpoint of synthesis suitability.

From the viewpoint of the fact that it is facilitated to allow the specific dichroic dye compound to have absorption on the short wavelength side (for example, having a maximum absorption wavelength at about 500 to 530 nm), E in Formula (1) is preferably an oxygen atom.

From the viewpoint of the fact that it is facilitated to allow the specific dichroic dye compound to have absorption on the long wavelength side (for example, having a maximum absorption wavelength at about 600 nm), E in Formula (3) is preferably a nitrogen atom.

In Formula (3), $R^2$ represents any one of a hydrogen atom, a halogen atom, an alkyl group which may have a substituent, or an alkoxy group which may have a substituent, and is preferably a hydrogen atom or an alkyl group which may have a substituent.

Next, the "alkyl group which may have a substituent" and the "alkoxy group which may have a substituent" represented by $R^2$ will be described.

Examples of the substituent include a halogen atom.

Examples of the alkyl group include linear, branched, or cyclic alkyl groups having 1 to 8 carbon atoms. Among these, a linear alkyl group having 1 to 6 carbon atoms is preferable, a linear alkyl group having 1 to 3 carbon atoms is more preferable, and a methyl group or an ethyl group is even more preferable.

Examples of the alkoxy group include alkoxy groups having 1 to 8 carbon atoms. Among these, an alkoxy group having 1 to 6 carbon atoms is preferable, an alkoxy group having 1 to 3 carbon atoms is more preferable, and a methoxy group or an ethoxy group is even more preferable.

In Formula (3), $R^3$ represents a hydrogen atom or an alkyl group which may have a substituent, and is preferably an alkyl group which may have a substituent.

Since specific examples and preferable aspects of the "alkyl group which may have a substituent" represented by $R^3$ are similar to those of the "alkyl group which may have a substituent" represented by $R^2$ of Formula (3), the description thereof will be omitted. In a case where E is a nitrogen atom, $R^3$ is a group existing in Formula (2) (that is, p=1). In a case where E is an oxygen atom or a sulfur atom, $R^3$ is a group which does not exist in Formula (3) (that is, p=0).

In Formula (3), $R^4$ represents a hydrogen atom or a substituent.

Since specific examples and preferable aspects of the "substituent" represented by $R^4$ are the same as those of the substituent in the "divalent aromatic group which may have a substituent", the description thereof will be omitted.

In Formula (3), p represents 0 or 1. In a case where E is a nitrogen atom, p is 1, and in a case where E is an oxygen atom or a sulfur atom, p is 0.

Specific examples of the specific dichroic dye compound represented by Formula (2) include the compounds described in paragraphs [0051] to [0081] of JP2010-152351A, and the contents thereof are incorporated herein.

Among these, preferable examples of the specific dichroic dye compound having a structure represented by Formula (3) include the compounds (D-1) to (D-53) described in paragraphs [0074] to [0081] of JP2010-152351A and the following compounds (D-54) to (D-58).

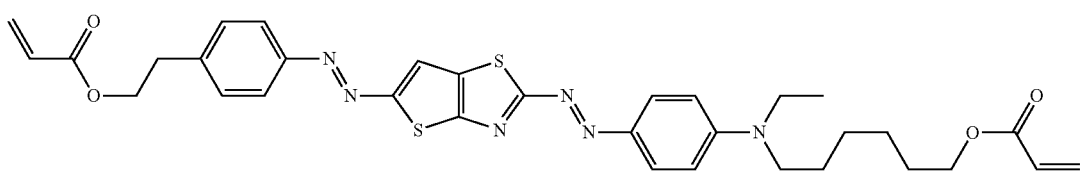
(D-53)

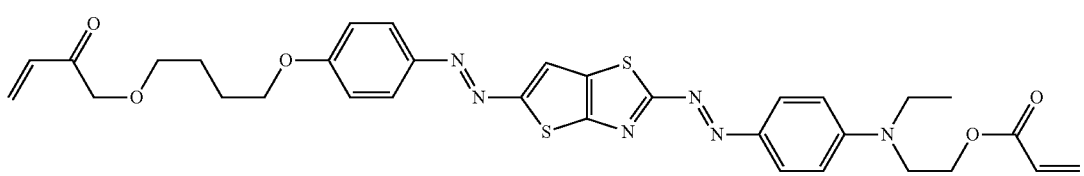
(D-54)

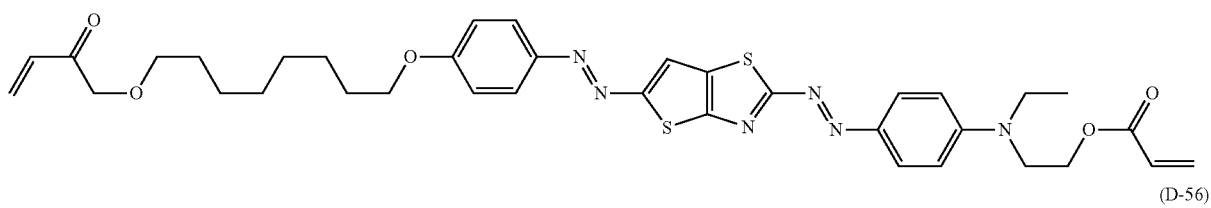
(D-55)

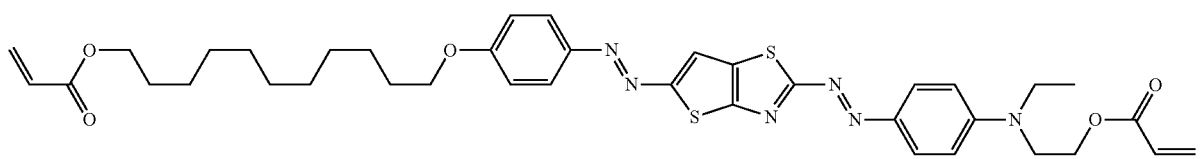
(D-56)

(D-57)

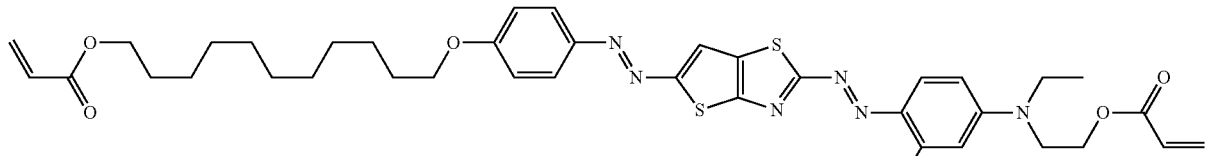

(D-58)

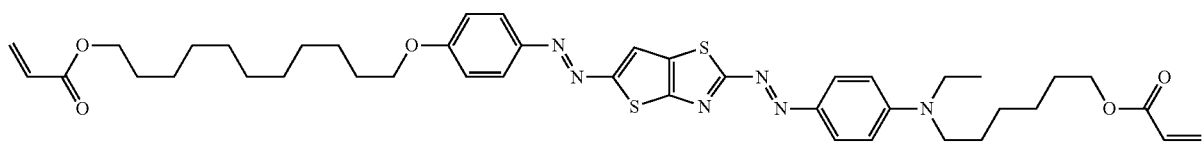

The content of the dichroic substance contained in the liquid crystal composition is preferably 1 to 40 mass %, and more preferably 3 to 25 mass % with respect to the total mass of the solid content.

<Interface Improver>

The liquid crystal composition preferably contains an interface improver. Due to the interface improver contained, the smoothness of the coating surface is improved, and the alignment degree is further improved or cissing and unevenness are suppressed. Thus, an improvement in the in-plane uniformity is anticipated.

As the interface improver, a material making the liquid crystalline compound horizontal on the coating surface side is preferable, and the compounds (horizontal alignment agents) described in paragraphs 0253 to 0293 of JP2011-237513A can be used. In a case where the liquid crystal composition contains an interface improver, the content of the interface improver is preferably 0.001 to 5 parts by mass, and more preferably 0.01 to 3 parts by mass with respect to a total of 100 parts by mass of the dichroic substance and the compound B1 (particularly, the above-described polymer liquid crystalline compound) in the liquid crystal composition.

<Polymerization Initiator>

The liquid crystal composition may contain a polymerization initiator.

Examples of the polymerization initiator are similar to those described in the barrier layer forming composition.

<Solvent>

From the viewpoint of workability and the like, the liquid crystal composition preferably contains a solvent.

Examples of the solvent are similar to those described in the barrier layer forming composition.

<Forming Method>

The method of forming a light absorption anisotropic film B using the above-described liquid crystal composition is not particularly limited, and examples thereof include a method including a step of forming a coating film by applying the liquid crystal composition to a transparent support to be described later (hereinafter, also referred to as "coating film forming step") and a step of aligning a liquid crystalline component contained in the coating film (hereinafter, also referred to as "alignment step") in this order.

In a case where the above-described dichroic substance has liquid crystallinity, the liquid crystalline component includes the dichroic substance having liquid crystallinity, as well as the above-described liquid crystalline compound.

(Coating Film Forming Step)

The coating film forming step is a step of forming a coating film by applying the liquid crystal composition to a transparent support.

By using a liquid crystal composition containing the above-described solvent, or a liquid material such as a molten liquid obtained by heating the liquid crystal composition, the liquid crystal composition is easily applied to the transparent support.

Examples of the method of applying the liquid crystal composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

In this aspect, an example has been given in which the liquid crystal composition is applied to the transparent support, but the present invention is not limited thereto. For example, the liquid crystal composition may be applied to an alignment film provided on the transparent support. Details of the alignment film will be described later.

(Alignment Step)

The alignment step is a step of aligning a liquid crystalline component contained in the coating film. Thus, a light absorption anisotropic film is obtained.

The alignment step may have a drying treatment. Through the drying treatment, a component such as a solvent can be removed from the coating film. The drying treatment may be performed by a method of leaving the coating film for a predetermined time at room temperature (for example, natural drying), or a heating and/or air blowing method.

Here, the liquid crystalline component contained in the liquid crystal composition may be aligned by the above-described coating film forming step or drying treatment. For example, in an aspect in which the liquid crystal composition is prepared as a coating liquid containing a solvent, the coating film is dried to remove the solvent from the coating film, and thus a coating film having light absorption anisotropy (that is, light absorption anisotropic film) is obtained.

In a case where the drying treatment is performed at a temperature that is equal to or higher than a temperature of transition of the liquid crystalline component contained in the coating film to a liquid crystalline phase, a heating treatment to be described below may not be performed.

The temperature of transition of the liquid crystalline component contained in the coating film to a liquid crystalline phase is preferably 10° C. to 250° C., and more preferably 25° C. to 190° C. from the viewpoint of manufacturing suitability or the like. The transition temperature is preferably 10° C. or higher since a cooling treatment or the like for lowering the temperature to a temperature range in which the liquid crystalline phase appears is not required. In addition, the transition temperature is preferably 250° C. or lower since high temperatures are not required even in transition to an isotropic liquid state at a much higher temperature than the temperature range in which the liquid crystalline phase appears, and wasting of thermal energy and deformation and deterioration of the substrate can thus be reduced.

The alignment step preferably has a heating treatment. Accordingly, the liquid crystalline component contained in the coating film can be aligned, and thus the coating film after the heating treatment can be preferably used as a light absorption anisotropic film.

The heating treatment is preferably performed at 10° C. to 250° C., and more preferably at 25° C. to 190° C. in view of manufacturing suitability or the like. The heating time is preferably 1 to 300 seconds, and more preferably 1 to 60 seconds.

The alignment step may have a cooling treatment to be performed after the heating treatment. The cooling treatment is a treatment for cooling the coating film after the heating to about room temperature (20° C. to 25° C.). Accordingly, the alignment of the liquid crystalline component contained in the coating film can be fixed. The cooling means is not particularly limited, and the cooling can be performed by a known method.

By the above steps, a light absorption anisotropic film can be obtained.

In this aspect, examples of the method of aligning the liquid crystalline component contained in the coating film include the drying treatment and the heating treatment, but are not limited thereto, and the alignment can be performed by a known alignment treatment.

(Other Steps)

The forming method of a light absorption anisotropic film B may have a step of curing the light absorption anisotropic film B (hereinafter, also referred to as "curing step") after the alignment step.

For example, the curing step is performed by heating and/or light irradiation (exposure) in a case where the light absorption anisotropic film B has a crosslinking group (polymerizable group). Among these, light irradiation is preferably performed to conduct the curing step.

As the light source used for curing, various light sources can be used such as infrared rays, visible light, and ultraviolet rays, and ultraviolet rays are preferable. In the curing, ultraviolet rays may be applied while heating is performed. Otherwise, ultraviolet rays may be applied via a filter which transmits only a component with a specific wavelength.

In a case where the exposure is performed while heating is performed, the heating temperature during the exposure is preferably 25° C. to 140° C. although it depends on the temperature of transition of the liquid crystalline component contained in the light absorption anisotropic film to a liquid crystalline phase.

In addition, the exposure may be performed under a nitrogen atmosphere. In a case where the light absorption anisotropic film B is cured by radical polymerization, inhibition of the polymerization by oxygen is reduced, and thus the exposure is preferably performed under a nitrogen atmosphere.

In the present invention, the thickness of the light absorption anisotropic film B is not particularly limited. The thickness is preferably 0.1 to 5.0 μm, and more preferably 0.3 to 1.5 μm.

[Transparent Support]

The laminate according to the embodiment of the present invention may have a transparent support on a side of the light absorption anisotropic film B opposite to the barrier layer A.

Here, the term "transparent" in the present invention indicates that the visible light transmittance is 60% or greater, and the visible light transmittance is preferably 80% or greater, and particularly preferably 90% or greater.

Examples of the material which forms the transparent support include polycarbonate polymers; polyester polymers such as polyethylene terephthalate (PET) and polyethylene naphthalate; acrylic polymers such as polymethyl methacrylate; styrene polymers such as polystyrene and acrylonitrile/styrene copolymer (AS resin); polyolefin polymers such as polyethylene, polypropylene, and ethylene/propylene copolymer; vinyl chloride polymers; amide polymers such as nylon and aromatic polyamide; imide polymers; sulfone polymers; polyethersulfone polymers; polyetheretherketone polymers; polyphenylene sulfide polymers; vinylidene chloride polymers; vinyl alcohol polymers; vinyl butyral polymers; arylate polymers; polyoxymethylene polymers; and epoxy polymers.

Thermoplastic norbornene resins can be preferably used as a material which forms the transparent support. Examples of the thermoplastic norbornene resins include ZEONEX and ZEONOR manufactured by ZEON CORPORATION, and ARTON manufactured JSR Corporation.

Cellulose polymers represented by triacetyl cellulose (TAC) can also be preferably used as a material which forms the transparent support.

In the present invention, the thickness of the transparent support is not particularly limited. The thickness is preferably 100 μm or less, more preferably 80 m or less, and even more preferably 10 to 80 μm.

[Alignment Film]

The laminate according to the embodiment of the present invention may have an alignment film between the transparent support and the light absorption anisotropic film B.

Examples of the method of forming the alignment film include a rubbing treatment for a film surface using an organic compound (preferably a polymer), oblique deposition of an inorganic compound, formation of a layer having microgrooves, and accumulation of an organic compound (for example, w-tricosanoic acid, dioctadecylmethylammonium chloride, and methyl stearylate) according to a Langmuir-Blodgett method (LB film). Furthermore, there have been known alignment films having an aligning function imparted thereto by applying an electrical field, applying a magnetic field, or light irradiation.

Among these, an alignment film formed by a rubbing treatment is preferable in view of easy control of a pretilt angle of the alignment film, and a photo-alignment film formed by light irradiation is also preferable in view of alignment uniformity in the present invention.

<Rubbed Alignment Film>

The polymer material used for an alignment film formed by a rubbing treatment is described in many literatures, and many commercially available products are available. In the present invention, polyvinyl alcohol or polyimide, or derivatives thereof can be preferably used. Regarding the alignment film, the description in the 24th line on page 43 to 8th line on page 49 in WO01/088574A1 can be referred to. The thickness of the alignment film is preferably 0.01 to 10 µm, and more preferably 0.01 to 1 µm.

<Photo-Alignment Film>

The photo-alignment compound used for an alignment film formed by light irradiation is described in many literatures. In the present invention, preferable examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, and esters are more preferable.

Among these, a photosensitive compound having a photoreactive group which generates at least one of dimerization or isomerization by the action of light is preferably used as the photo-alignment compound.

In addition, the photoreactive group preferably has a skeleton of at least one derivative or compound selected from the group consisting of a cinnamic acid derivative, a coumarin derivative, a chalcone derivative, a maleimide derivative, an azobenzene compound, a polyimide compound, a stilbene compound, and a spiropyran compound.

To a photo-alignment film formed from the above-described material, linearly polarized light or unpolarized light is applied to manufacture a photo-alignment film.

In this specification, the "linearly polarized light irradiation" and the "unpolarized light irradiation" are operations for causing a photoreaction to the photo-alignment material. The wavelength of the light used varies depending on the photo-alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and an YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or oblique to the alignment film surface is employed. Although the incidence angle of the light varies depending on the photo-alignment material, the incidence angle is preferably 0° to 90° (vertical), and more preferably 40° to 90°.

In a case where unpolarized light is used, the alignment film is irradiated with unpolarized light from an oblique direction. The incidence angle of the light is preferably 10° to 80°. more preferably 20° to 60° and even more preferably 30° to 50°. The irradiation time is preferably 1 minute to 60 minutes, and more preferably 1 minute to 10 minutes.

In a case where patterning is required, a method of performing light irradiation using a photomask as many times as necessary for pattern formation, or a pattern writing method using laser beam scanning can be employed.

In the present invention, since the adhesiveness between the barrier layer A and the light absorption anisotropic film B is further improved in a case where the alignment film is included, the alignment film preferably contains a component same as the highest content of the compound A1 contained in the barrier layer A described above. Whether or not the component same as the compound A1 is contained can be confirmed by measuring a portion corresponding to the alignment film in a cross-section of the laminate by TOF-SIMS under the above-described measurement conditions.

[Adhesive Layer]

The laminate according to the embodiment of the present invention may have an adhesive layer on a side of the barrier layer A opposite to the light absorption anisotropic film B from the viewpoint of bonding, to the side of the barrier layer A opposite to the light absorption anisotropic film B, another functional layer (for example, λ/4 plate to be described later).

In this specification, the "adhesive layer" is a concept including the "pressure sensitive layer". Here, the term "pressure sensitive adhesion" is a type of adhesion, and means that the attachment force (pressure sensitive adhesive force) little changes even after a certain period of time after attachment to an attachment object and peeling can be performed as necessary. In addition, the term "adhesion" is a concept including the above "pressure sensitive adhesion", and simply means that objects to be attached are integrally attached.

The adhesive layer preferably contains a pressure sensitive adhesive.

Examples of the pressure sensitive adhesive include rubber pressure sensitive adhesives, (meth)acrylic pressure sensitive adhesives, silicone pressure sensitive adhesives, urethane pressure sensitive adhesives, vinyl alkyl ether pressure sensitive adhesives, polyvinyl alcohol pressure sensitive adhesives, polyvinylpyrrolidone pressure sensitive adhesives, polyacrylamide pressure sensitive adhesives, and cellulose pressure sensitive adhesives.

Among these, acrylic pressure sensitive adhesives (pressure sensitive adhesives) are preferable from the viewpoints of transparency, weather fastness, heat resistance, and the like.

The adhesive layer can be formed by, for example, a method in which a pressure sensitive adhesive solution (adhesive composition) is applied on a peeling sheet, dried, and then transferred to the surface of the barrier layer A; a method in which a pressure sensitive adhesive solution is directly applied to the surface of the barrier layer A and dried; or the like.

The pressure sensitive adhesive solution (adhesive composition) is prepared as, for example, a solution of about 10 to 40 mass % of a pressure sensitive adhesive dissolved or dispersed in a solvent such as toluene or ethyl acetate.

As an application method, a roll coating method such as reverse coating or gravure coating, a spin coating method, a screen coating method, a fountain coating method, a dipping method, a spray method, or the like can be employed.

Examples of the constituent material of the peeling sheet include thin leaf-like bodies such as a synthetic resin film such as polyethylene, polypropylene, and polyethylene terephthalate; a rubber sheet; paper; cloth; non-woven fabric; net; a foamed sheet; and metallic foil.

In the present invention, the thickness of the optional adhesive layer is not particularly limited. The thickness is preferably 3 μm to 50 μm, more preferably 4 μm to 40 μm, and even more preferably 5 μm to 30 μm.

[λ/4 Plate]

The laminate according to the embodiment of the present invention may have a λ/4 plate on a side of the adhesive layer opposite to the barrier layer A.

Here, the "λ/4 plate" is a plate having a λ/4 function, and specifically, a plate having a function of converting linearly polarized light with a specific wavelength into circularly polarized light (or converting circularly polarized light into linearly polarized light).

Specific examples of the λ/4 plate include US2015/0277006A.

Specific examples of the aspect in which the λ/4 plate has a single layer structure include a retardation film in which an optically anisotropic layer having λ/4 function is provided on a stretched polymer film or a support. Specific examples of the aspect in which the λ/4 plate has a multilayered structure include a broadband λ/4 plate having a laminate of a λ/4 plate and a ½ plate.

[Usage]

The laminate according to the embodiment of the present invention can be used as a polarizing element (polarizing plate). For example, it can be used as a linearly polarizing plate or a circularly polarizing plate.

In a case where the laminate according to the embodiment of the present invention has no optically anisotropic layer such as the λ/4 plate, the laminate can be used as a linearly polarizing plate. In a case where the laminate according to the embodiment of the present invention has the λ/4 plate, the laminate can be used as a circularly polarizing plate.

[Manufacturing Method of Laminate]

A manufacturing method of a laminate according to the embodiment of the present invention is a manufacturing method of the above-described laminate according to the embodiment of the present invention, and has a light absorption anisotropic film forming step of forming a light absorption anisotropic film B containing 50 mass % or greater of the compound B1 using a composition containing the compound B1 described above and a barrier layer forming step of forming a barrier layer A containing 50 mass % or greater of the compound A1 on the formed light absorption anisotropic film B using a composition containing the compound A1 described above.

The relationship between the compound A1 and the compound B1 satisfies a relationship in which the value of distance calculated from Hansen solubility parameters and represented by Formula (I) is within a range of 0.0 to 5.0.

[Light Absorption Anisotropic Film Forming Step]

The light absorption anisotropic film forming step is a step of forming a light absorption anisotropic film B containing 50 mass % or greater of the compound B1 using a composition containing the compound B1 described above.

Here, similarly to the liquid crystal composition described in the light absorption anisotropic film of the laminate according to the embodiment of the present invention, the composition containing the compound B1 may contain a dichroic substance, a surfactant, a polymerization initiator, a solvent, and other components together with the compound B (particularly, the above-described polymer liquid crystalline compound).

Examples of the method of forming the light absorption anisotropic film B using the composition containing the compound B1 include a method similar to the forming method described in the light absorption anisotropic film B of the laminate according to the embodiment of the present invention, that is, a forming method having the above-described coating film forming step and alignment step.

[Barrier Layer Forming Step]

The barrier layer forming step is a step of forming a barrier layer A containing 50 mass % or greater of the compound A1 on the above-described light absorption anisotropic film B using a composition containing the compound A1 described above.

Here, the composition containing the compound A1 may contain a polymerization initiator, a solvent, and other components together with the compound A1 (particularly, the above-described polymerizable compound).

Examples of the forming method of the barrier layer A using the composition containing the compound A1 include the same method as the forming method described in the barrier layer A of the laminate according to the embodiment of the present invention, that is, a method in which a composition is applied and dried, and then fixing is performed by polymerization.

[Image Display Device]

An image display device according to the embodiment of the present invention has the above-described laminate according to the embodiment of the present invention, and a display element installed on a side of the barrier layer A opposite to the light absorption anisotropic film B in the laminate.

The display element used for the image display device according to the embodiment of the present invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the present invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the embodiment of the present invention has the above-described laminate according to the embodiment of the present invention (including no λ/4 plate) and a liquid crystal cell.

In the present invention, among the laminates provided on both sides of the liquid crystal cell, the laminate according to the embodiment of the present invention is preferably used as the front-side polarizing element. More preferably, the laminate according to the embodiment of the present invention is used as the front-side and rear-side polarizing elements.

The liquid crystal cell of the liquid crystal display device will be described below in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, with no application of a voltage, rod-like liquid crystalline molecules are substantially horizontally aligned, and twist-aligned by 60° to 120°. The TN mode liquid crystal cell is most often used as a color thin film transistor (TFT) liquid crystal display device, and is described in many literatures.

In a VA mode liquid crystal cell, rod-like liquid crystalline molecules are substantially vertically aligned with no application of a voltage. The VA mode liquid crystal cell includes (1) a narrowly-defined VA mode liquid crystal cell in which rod-like liquid crystalline molecules are substantially vertically aligned with no application of a voltage, and are substantially horizontally aligned with the application of a voltage (described in JP1990-176625A (JP-H2-176625A)), (2) a (multi-domain vertical alignment (MVA) mode) liquid crystal cell in which the VA mode is made into multi-domains in order to expand the viewing angle (described in SID97, Digest of tech. Papers (proceedings) 28 (1997) 845), (3) an (axially symmetric aligned microcell (n-ASM) mode) liquid crystal cell in which rod-like liquid crystalline molecules are substantially vertically aligned with no application of a voltage, and are twisted in multi-domains with the application of a voltage (described in the proceedings 58 and 59 of Japanese Liquid Crystal Conference (1998)), and (4) a SURVIVAL mode liquid crystal cell (announced at liquid crystal display (LCD) internal 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are aligned substantially in parallel with respect to a substrate, and the liquid crystalline molecules respond in a planar manner with the application of an electric field parallel to a substrate surface. The IPS mode displays a black image with no application of an electric field, and the absorption axes of a pair of upper and lower polarizing plates are perpendicular to each other. A method of improving the viewing angle by reducing light leakage caused in the display of a black image in an oblique direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

For example, a preferable aspect of an organic EL display device as an example of the image display device according to the embodiment of the present invention is that the device has the above-described laminate according to the embodiment of the present invention (including a pressure sensitive layer and a λ/4 plate) and an organic EL display panel in this order from the visual recognition side. In this case, in the laminate, a transparent support, an alignment film to be optionally provided, a light absorption anisotropic film, a transparent resin layer, a pressure sensitive layer, and λ/4 plate are disposed in order from the visual recognition side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the present invention will be more specifically described based on examples. Materials, used amounts, ratios, treatment contents, treatment procedures, and the like shown in the following examples are able to be properly changed as long as the changes do not depart from the gist of the present invention. Therefore, the scope of the present invention will not be restrictively interpreted by the following examples.

Example 1

[Production of Transparent Support 1]

A blocking layer coating liquid 1 having the following composition was continuously applied to a TAC base (TG40, manufactured by FUJIFILM Corporation) having a thickness of 40 μm using a wire bar #17.

The applied liquid was dried for 2 minutes at 100° C., and thus a transparent support 1 in which a polyvinyl alcohol (PVA) blocking layer having a thickness of 1.2 μm was formed on the TAC base was obtained.

The modified polyvinyl alcohol was added to the blocking layer coating liquid 1 such that the solid content concentration was 6.5 wt %.

| Composition of Blocking Layer Coating Liquid 1 | |
|---|---|
| Following Modified Polyvinyl Alcohol | 15 parts by mass |
| Polymerization Initiator IRGACURE 2959 (manufactured by BASF SE) | 0.75 part by mass |
| Isopropyl Alcohol (IPA) | 44 parts by mass |
| Dimethyl Sulfoxide (DMSO) | 0.91 parts by mass |
| Propylene Glycol Monomethyl Ether Acetate (PGMEA) | 4.2 parts by mass |
| Water | 166 parts by mass |

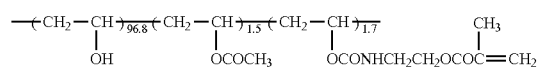

Modified Polyvinyl Alcohol

[Formation of Alignment Film C]

41.6 parts by mass of 2-butoxyethanol, 41.6 parts by mass of dipropylene glycol monomethyl ether, and 15.8 parts by mass of pure water were added to 1 part by mass of a photo-alignment material C-1 having the following structure, and the obtained solution was filtered under pressure with a 0.45 μm membrane filter to prepare a photo-alignment film coating liquid 1.

Next, the obtained photo-alignment film coating liquid 1 was applied to the transparent support 1, and dried for 1 minute at 60° C. Then, the obtained coating film was irradiated with linearly polarized ultraviolet rays (illuminance: 4.5 mW, irradiation dose: 300 mJ/cm$^2$) using a polarized ultraviolet exposure device to produce an alignment film C.

Photo-Alignment Material C-1

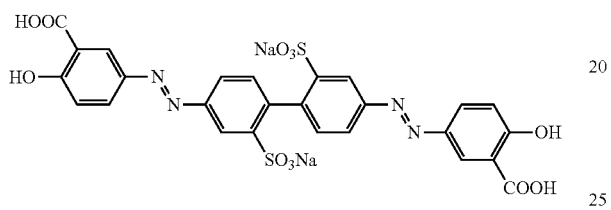

[Formation of Light Absorption Anisotropic Film B]

A light absorption anisotropic film forming composition 1 having the following composition was continuously applied to the obtained alignment film C using a wire bar #4, and a coating film 1 was formed.

Next, the coating film 1 was heated for 90 seconds at 140° C., and the coating film 1 was cooled to room temperature (23° C.).

Next, the coating film was heated for 60 seconds at 80° C., and cooled again to room temperature.

Then, irradiation was performed under an irradiation condition of an illuminance of 30 mW/cm$^2$ for 10 seconds using a high-pressure mercury lamp to produce a light absorption anisotropic film B on the alignment film C.

| Composition of Light Absorption Anisotropic Film Forming Composition 1 | |
|---|---|
| Following Polymer Liquid Crystalline Compound L-1 | 36.0 parts by mass |
| Following Dye dye-1 | 1.1 parts by mass |
| Following Dye dye-2 | 4.7 parts by mass |
| Polymerization Initiator IRGACURE 819 (manufactured by BASF SE) | 0.4 parts by mass |
| Following Interface Improver F-1 | 0.3 parts by mass |
| Tetrahydrofuran | 320.0 parts by mass |
| Cyclopentanone | 137.0 parts by mass |

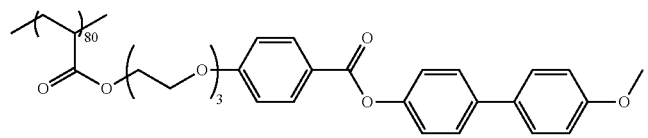

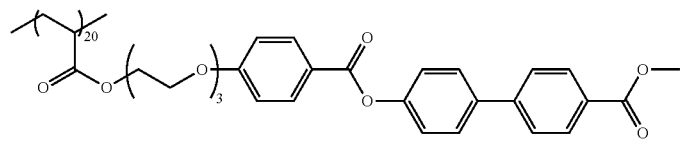

Polymer Liquid Crystalline Compound L-1

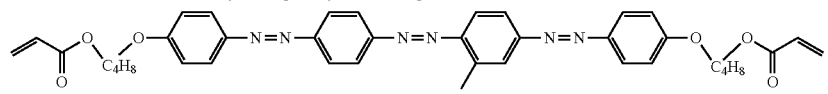

Dye dye-1

| Composition of Light Absorption Anisotropic Film Forming Composition 1 |
| --- |

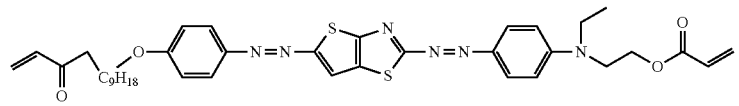

Dye dye-2

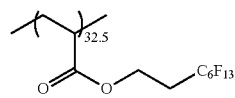

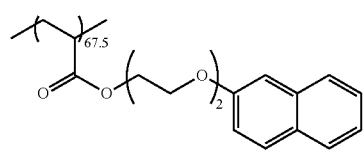

Interface Improver F-1

[Formation of Barrier Layer A]

The following barrier layer forming composition 1 was continuously applied to the light absorption anisotropic film B using a wire bar #2, and dried for 90 seconds at 40° C.

Then, irradiation was performed under an irradiation condition of an illuminance of 30 mW/cm² for 10 seconds using a high-pressure mercury lamp, and the resin composition was cured. Accordingly, a laminate in which a barrier layer A was formed on the light absorption anisotropic film B was produced.

A cross-section of the barrier layer A was cut using a microtome cutting machine, and a film thickness was measured with a scanning electron microscope (SEM). The film thickness was about 0.7 µm.

| Barrier Layer Forming Composition 1 | |
| --- | --- |
| Following CEL2021P (manufactured by Daicel Corporation) | 144 parts by mass |
| IRGACURE 819 (manufactured by BASF SE) | 3 parts by mass |
| Following Photocationic Polymerization Initiator [CPI-100P (propylene carbonate solution), manufactured by San-Apro Ltd.] | 6 parts by mass |
| Following Interface Improver F-2 | 0.3 parts by mass |
| Methyl Ethyl Ketone (MEK) | 347 parts by mass |

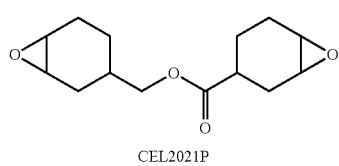 [SMILES: O=C(OCC1CCC2OC2C1)C1CCC2OC2C1]

CEL2021P

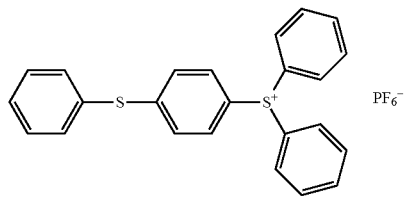

Photocationic Polymerization Initiator (CPI-100P)

| Barrier Layer Forming Composition 1 |
| --- |

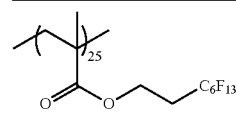

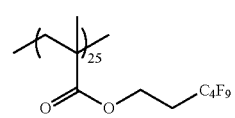

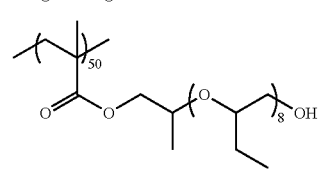

Interface Improver F-2

Example 2

A laminate was produced in the same manner as in Example 1, except that a light absorption anisotropic film forming composition 2 having the following composition was used instead of the light absorption anisotropic film forming composition 1, and a wire bar #11 was used instead of the wire bar #4.

| Composition of Light Absorption Anisotropic Film Forming Composition 2 | |
| --- | --- |
| Above Polymer Liquid Crystalline Compound L-1 | 50.6 parts by mass |
| Above Dye dye-1 | 3.5 parts by mass |
| Above Dye dye-2 | 4.6 parts by mass |
| Polymerization Initiator IRGACURE 819 (manufactured by BASF SE) | 0.5 parts by mass |
| Above Interface Improver F-1 | 0.1 parts by mass |
| Tetrahydrofuran | 132.2 parts by mass |
| Cyclopentanone | 308.5 parts by mass |

Example 3

A laminate was produced in the same manner as in Example 1, except that a barrier layer forming composition 2 having the following composition was used instead of the barrier layer forming composition 1.

| Barrier Layer Forming Composition 2 | |
|---|---|
| Above CEL2021P (manufactured by Daicel Corporation) | 111 parts by mass |
| Alumina Ethanol Sol A2K5-10 (manufactured by Kawaken Fine Chemicals Co., Ltd., colloidal liquid in which columnar hydrated alumina grains are dispersed in liquid) | 115 parts by mass |
| IRGACURE 819 (manufactured by BASF SE) | 2 parts by mass |
| Above CPI-100P (propylene carbonate solution) | 5 parts by mass |
| Methyl Ethyl Ketone | 267 parts by mass |

Example 4

A laminate was produced in the same manner as in Example 1, except that a light absorption anisotropic film forming composition 3 having the following composition was used instead of the light absorption anisotropic film forming composition 1.

| Composition of Light Absorption Anisotropic Film Forming Composition 3 | |
|---|---|
| Above Polymer Liquid Crystalline Compound L-1 | 24.3 parts by mass |
| Above Dye dye-1 | 0.8 parts by mass |
| Following Dye dye-3 | 3.3 parts by mass |
| Following Dye dye-4 | 1.2 parts by mass |
| Polymerization Initiator IRGACURE 819 (manufactured by BASF SE) | 0.25 parts by mass |
| Above Interface Improver F-1 | 0.21 parts by mass |
| Tetrahydrofuran | 329.0 parts by mass |
| Cyclopentanone | 141.0 parts by mass |

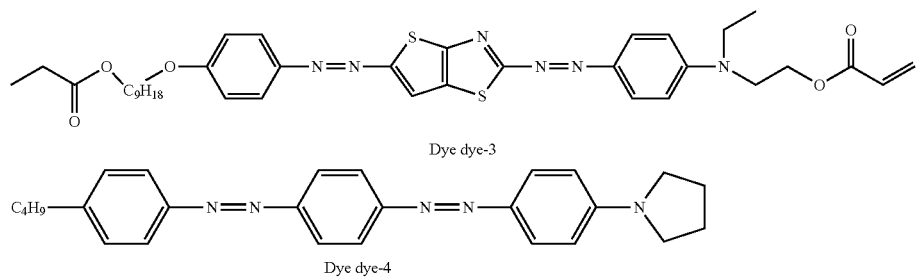

Dye dye-3

Dye dye-4

Example 5

A laminate was produced in the same manner as in Example 3, except that the light absorption anisotropic film forming composition 3 used in Example 4 was used instead of the light absorption anisotropic film forming composition 1.

Example 6

A laminate was produced in the same manner as in Example 1, except that a barrier layer forming composition 3 having the following composition was used instead of the barrier layer forming composition 1.

| Barrier Layer Forming Composition 3 | |
|---|---|
| Above CEL2021P (manufactured by Daicel Corporation) | 139 parts by mass |
| IRGACURE 819 (manufactured by BASF SE) | 3 parts by mass |

| Barrier Layer Forming Composition 3 | |
|---|---|
| Following Photocationic Polymerization Initiator PAG-1 | 8 parts by mass |
| Above Interface Improver F-2 | 0.3 parts by mass |
| Methyl Ethyl Ketone (MEK) | 350 parts by mass |

Photocationic Polymerization Initiator PAG-1

Example 7

A laminate was produced in the same manner as in Example 1, except that a barrier layer forming composition 4 having the following composition was used instead of the barrier layer forming composition 1.

| Barrier Layer Forming Composition 4 | |
|---|---|
| Above CEL2021P (manufactured by Daicel Corporation) | 113 parts by mass |
| Tetrabutanetetracarboxylate (3,4-epoxycyclohexylmethyl)-modified ε-caprolactone [EPOLEAD GT401, manufactured by Daicel Corporation] | 107 parts by mass |
| IRGACURE 819 (manufactured by BASF SE) | 2 parts by mass |
| Above CPI-100P (propylene carbonate solution) | 5 parts by mass |
| Methyl Ethyl Ketone (MEK) | 273 parts by mass |

Example 8

A laminate was prepared in the same manner as in Example 1, except that a barrier layer forming composition 5 having the following composition was used instead of the barrier layer forming composition 1.

| Barrier Layer Forming Composition 5 | |
|---|---|
| Above CEL2021P (manufactured by Daicel Corporation) | 136 parts by mass |
| Polyvinyl Butyral (ESLEC K.S-10, manufactured by Sekisui Chemical Co., Ltd.) | 28 parts by mass |
| IRGACURE 819 (manufactured by BASF SE) | 3 parts by mass |
| Above CPI-100P (propylene carbonate solution) | 6 parts by mass |
| Methyl Ethyl Ketone (MEK) | 327 parts by mass |

Example 9

A laminate was prepared in the same manner as in Example 1, except that a barrier layer forming composition 6 having the following composition was used instead of the barrier layer forming composition 1.

| Barrier Layer Forming Composition 6 | |
|---|---|
| Above CEL2021P (manufactured by Daicel Corporation) | 144 parts by mass |
| IRGACURE 819 (manufactured by BASF SE) | 3 parts by mass |
| Above CPI-100P (propylene carbonate solution) | 6 parts by mass |
| MEGAFAC RS-90 (made by DIG Corporation) | 0.3 parts by mass |
| Methyl Ethyl Ketone (MEK) | 347 parts by mass |

Examples 10 to 14

A laminate was produced in the same manner as in Example 1, except that a compound shown in the following Table 1 and represented by the following formula was used instead of CEL2021P (manufactured by Daicel Corporation).

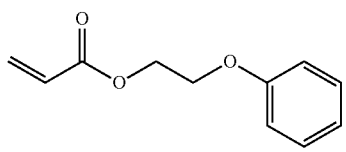

2-Phenoxyethyl Acrylate

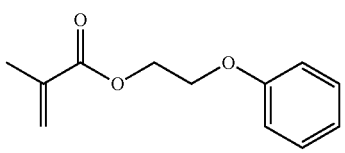

2-Phenoxyethyl Methacrylate

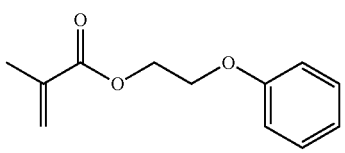

CYCLOMER M100

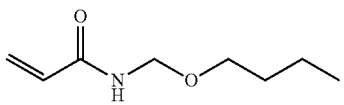

N-(Buthoxymethyl)acrylamide

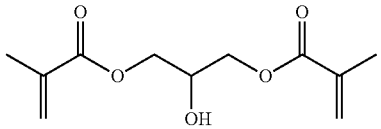

BLEMMER GMR

Comparative Examples 1 to 4

A laminate was produced in the same manner as in Example 1, except that a compound shown in the following Table 1 and represented by the following formula was used instead of CEL2021P (manufactured by Daicel Corporation).

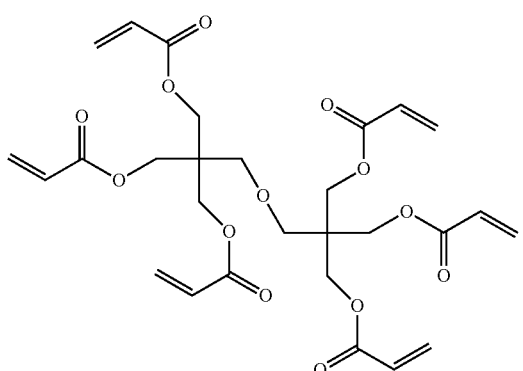

DPHA

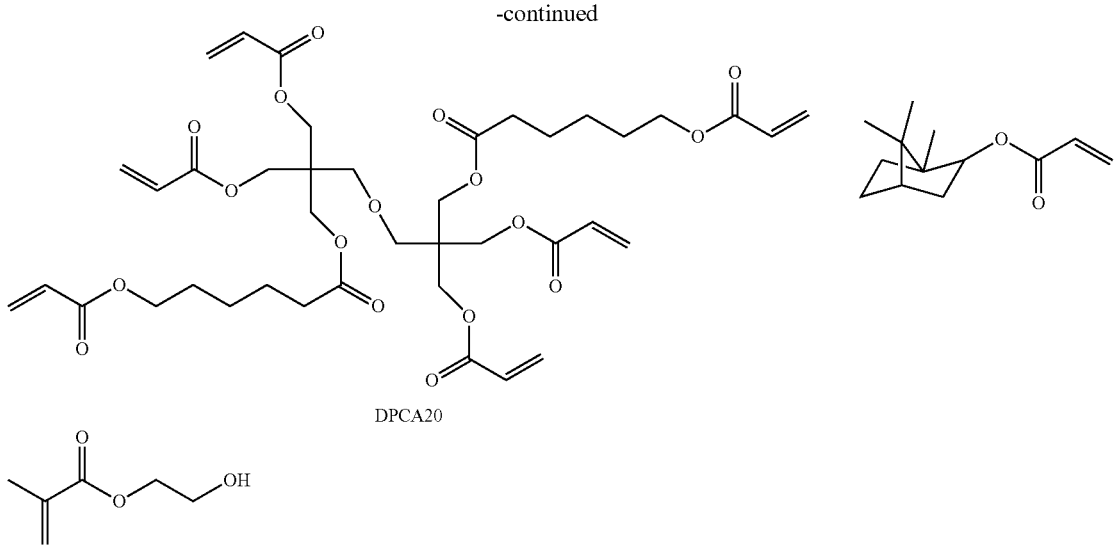

DPCA20

Isobornyl Acrylate Ethylene Glycol Methacrylate

Regarding the produced laminate, the contents of the compounds A1 and B1 were measured by the above-described method, and the Hansen solubility parameters of the compound A1 and the compound B1 and the value of distance represented by Formula (I) were calculated. The results thereof are shown in Table 1.

In the laminates produced in Examples 1 to 14, it could be confirmed that the compound A1 was contained in the light absorption anisotropic film B and also in the alignment film C.

[Alignment Degree]

Regarding the produced laminate, the alignment degree was calculated by the above-described method using an automatic polarizing film measuring device VAP-7070 manufactured by JASCO Corporation. The results are shown in the following Table 1.

[Adhesiveness]

Regarding the produced laminate, 11 cuts were made in the vertical direction and in the horizontal direction by a cutter knife in a grid pattern on the surface on which the barrier layer A was provided. A total of 100 square cells were formed, and a polyester pressure sensitive tape (No. 31B) manufactured by Nitto Denko Corporation was attached to the surface. After a lapse of 30 minutes, the tape was quickly peeled off in the vertical direction, and the number of peeled cells was counted and evaluated based on the following criteria. The results are shown in the following Table 1.

A: No peeling was observed at 100 squares.
B: Peeling of 1 to 10 squares was observed in 100 squares (within the allowable range).
C: Peeling of 10 or more squares was observed in 100 squares.

TABLE 1

| | Barrier Layer A | | Light Absorption Anisotropic Film B | | | | | Hansen Solubility parameters | | | Formula (I) distance | Evaluation | |
|---|---|---|---|---|---|---|---|---|---|---|---|---|---|
| | Compound A1 (compound of the maximum content) | Content of A1 [wt %] | Compound B1 (compound of the maximum content) | Content of B1 [wt %] | Dichroic Substance (dye) | | | $\delta_D$ | $\delta_P$ | $\delta_H$ | | Visibility-Corrected Alignment Degree | Adhesiveness |
| Example 1 | CEL2021P | 96 | L-1 | 85 | dye-1 | dye-2 | — | 17.4 | 7.3 | 6.8 | 1.7 | 0.96 | A |
| Example 2 | CEL2021P | 96 | L-1 | 85 | dye-1 | dye-2 | — | 17.4 | 7.3 | 6.8 | 1.7 | 0.96 | A |
| Example 3 | CEL2021P | 87 | L-1 | 85 | dye-1 | dye-2 | — | 17.4 | 7.3 | 6.8 | 1.7 | 0.96 | A |
| Example 4 | CEL2021P | 96 | L-1 | 85 | dye-1 | dye-3 | dye-4 | 17.4 | 7.3 | 6.8 | 1.7 | 0.97 | A |
| Example 5 | CEL2021P | 87 | L-1 | 85 | dye-1 | dye-3 | dye-4 | 17.4 | 7.3 | 6.8 | 1.7 | 0.97 | A |
| Example 6 | CEL2021P | 93 | L-1 | 85 | dye-1 | dye-2 | — | 17.4 | 7.3 | 6.8 | 1.7 | 0.96 | A |
| Example 7 | CEL2021P | 50 | L-1 | 85 | dye-1 | dye-2 | — | 17.4 | 7.3 | 6.8 | 1.7 | 0.96 | A |
| Example 8 | CEL2021P | 80 | L-1 | 85 | dye-1 | dye-2 | — | 17.4 | 7.3 | 6.8 | 1.7 | 0.96 | A |
| Example 9 | CEL2021P | 96 | L-1 | 85 | dye-1 | dye-2 | — | 17.4 | 7.3 | 6.8 | 1.7 | 0.96 | A |
| Example 10 | 2-Phenoxyethyl Acrylate | 98 | L-1 | 85 | dye-1 | dye-2 | — | 17.9 | 5.4 | 6.4 | 2.5 | 0.94 | A |
| Example 11 | 2-Phenoxyethyl Methacrylate | 98 | L-1 | 85 | dye-1 | dye-2 | — | 17.7 | 4.9 | 5.7 | 3.2 | 0.94 | A |
| Example 12 | CYCLOMER M100 | 98 | L-1 | 85 | dye-1 | dye-2 | — | 17 | 5.4 | 5.9 | 3.5 | 0.94 | B |
| Example 13 | N-(Buthoxymethyl)acrylamide | 98 | L-1 | 85 | dye-1 | dye-2 | — | 17.1 | 10.9 | 8.2 | 4.1 | 0.96 | B |

TABLE 1-continued

| | Barrier Layer A | | Compound B1 | | Dichroic Substance (dye) | | | Hansen Solubility parameters | | | Formula (I) distance | Evaluation Visibility-Corrected Alignment Degree | Adhesiveness |
|---|---|---|---|---|---|---|---|---|---|---|---|---|---|
| | Compound A1 (compound of the maximum content) | Content of A1 [wt %] | compound of the maximum content | Content of B1 [wt %] | | | | $\delta_D$ | $\delta_P$ | $\delta_H$ | | | |
| Example 14 | BLEMMER GMR | 98 | L-1 | 85 | dye-1 | dye-2 | — | 16.8 | 6.3 | 10.2 | 4.8 | 0.94 | B |
| Comparative Example 1 | DPHA | 98 | L-1 | 85 | dye-1 | dye-2 | — | 17.1 | 3.1 | 5.6 | 5.2 | 0.96 | C |
| Comparative Example 2 | DPCA20 | 98 | L-1 | 85 | dye-1 | dye-2 | — | 17.3 | 2.1 | 3.5 | 6.7 | 0.96 | C |
| Comparative Example 3 | Isobornyl Acrylate | 98 | L-1 | 85 | dye-1 | dye-2 | — | 16.7 | 2.6 | 2.8 | 7.1 | 0.94 | C |
| Comparative Example 4 | Ethylene Glycol Methacrylate | 98 | L-1 | 85 | dye-1 | dye-2 | — | 16.6 | 7.5 | 13.4 | 7.5 | 0.94 | C |

From the results shown in Table 1, it was found that in a case where the relationship between the highest content of the compound A1 contained in the barrier layer A and the highest content of the compound B1 contained in the light absorption anisotropic film B was provided such that the value of distance calculated from Hansen solubility parameters and represented by Formula (I) was within a range of 0.0 to 5.0, the adhesiveness between the light absorption anisotropic film and the barrier layer was improved. (Examples 1 to 14).

Example 15

[Preparation of Photo-Alignment Film Composition]
<Synthesis of Polymer C-1>

A reaction container comprising a stirrer, a thermometer, a dropping funnel, and a reflux cooling pipe was charged with 100.0 parts by mass of 2-(3,4-epoxycyclohexyl)ethyl-trimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture from the dropping funnel for 30 minutes. Then, a reaction was caused for 6 hours at 80° C. during mixing of the mixture under reflux. After the reaction was terminated, the organic phase was taken out and washed with a 0.2 mass % aqueous ammonium nitrate solution until the water after washing became neutral. Thereafter, from the obtained organic phase, the solvent and the water were distilled off under reduced pressure to obtain an epoxy group-containing polyorganosiloxane as a viscous transparent liquid.

$^1$H-NMR (Nuclear Magnetic Resonance) analysis was performed on the epoxy group-containing polyorganosiloxane, and it was confirmed that a peak based on an oxiranyl group was obtained in accordance with a theoretical intensity in the vicinity of a chemical shift (d)=3.2 ppm, and a side reaction of the epoxy group did not occur during the reaction. A weight-average molecular weight Mw of the epoxy group-containing polyorganosiloxane was 2,200, and the epoxy equivalent was 186 g/mol.

Next, 100 mL of a three-neck flask was charged with 10.1 parts by mass of the epoxy group-containing polyorganosiloxane obtained as described above, 0.5 parts by mass of an acrylic group-containing carboxylic acid (TOAGOSEI CO., LTD., trade name "ARONIX M-5300", ω-carboxy poly-caprolactone acrylate (polymerization degree n≈2)), 20 parts by mass of butyl acetate, 1.5 parts by mass of a cinnamic acid derivative obtained by the method of Synthesis Example 1 in JP2015-026050A, and 0.3 parts by mass of tetrabutylammonium bromide, and the obtained mixture was stirred for 12 hours at 90° C. After the stirring, the obtained mixture was diluted with the same amount (mass) of butyl acetate, and the diluted mixture was water-washed 3 times. Concentration of the obtained mixture and dilution with butyl acetate were repeated 2 times, and finally, a solution containing a polyorganosiloxane (the following polymer C-1) having a photo-aligned group was obtained. A weight-average molecular weight Mw of the polymer C-1 was 9,000. In addition, as a result of $^1$H-NMR analysis, a component having a cinnamate group in the polymer C-1 was 23.7 mass %.

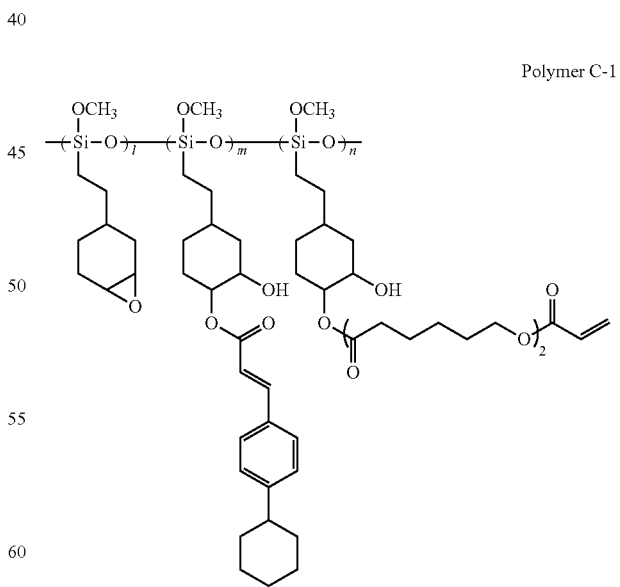

Polymer C-1

<Preparation of Photo-Alignment Film Forming Composition 2>

A photo-alignment film forming composition 2 was prepared by mixing the following components.

| | |
|---|---|
| Above Polymer C-1 | 10.67 parts by mass |
| Following Low-Molecular-Weight Compound B-1 | 5.17 parts by mass |
| Following Additive P-1 (TA-60B, manufactured by San-Apro Ltd.) | 0.53 parts by mass |
| Butyl Acetate | 8287.37 parts by mass |
| Propylene Glycol Monomethyl Ether Acetate | 2071.85 parts by mass |

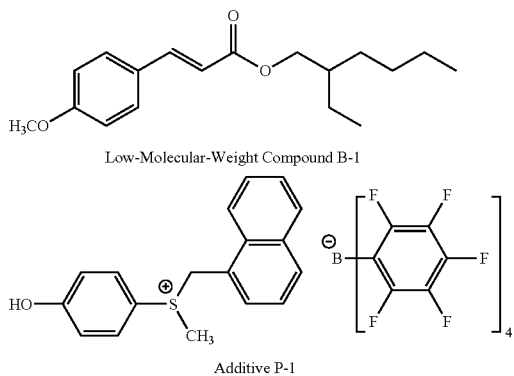

Low-Molecular-Weight Compound B-1

Additive P-1

[Preparation of Optically Anisotropic Layer Coating Liquid]

An optically anisotropic layer coating liquid having the following composition was prepared.

| Optically Anisotropic Layer Coating Liquid | |
|---|---|
| Following Liquid Crystalline Compound L-3 | 42.00 parts by mass |
| Following Liquid Crystalline Compound L-4 | 42.00 parts by mass |
| Following Polymerizable Compound A-1 | 16.00 parts by mass |
| Following Low-Molecular-Weight Compound B-1 | 6.00 parts by mass |
| Following Polymerization Initiator S-1 (oxime type) | 0.50 parts by mass |
| Following Leveling Agent G-1 | 0.20 parts by mass |
| HISOLVE MTEM (manufactured by TOHO Chemical Industry Co., Ltd.) | 2.00 parts by mass |
| NK ESTER A-200 (manufactured by Shin-Nakamura Chemical Co., Ltd) | 1.00 parts by mass |
| Methyl Ethyl Ketone | 424.8 parts by mass |

The group adjacent to the acryloyloxy group of the following liquid crystalline compounds L-3 and L-4 represents a propylene group (a group in which a methyl group is substituted by an ethylene group), and each of the following liquid crystalline compounds L-3 and L-4 represents a mixture of position isomers with different methyl group positions.

L-3

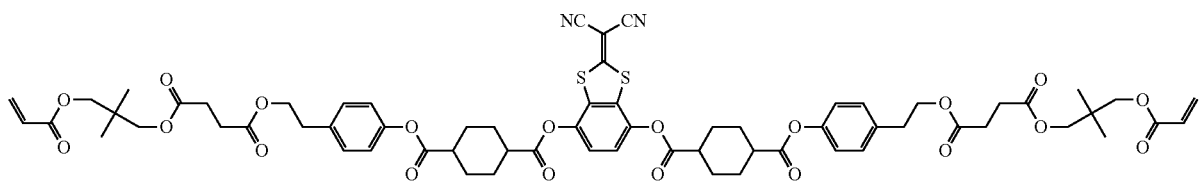

L-4

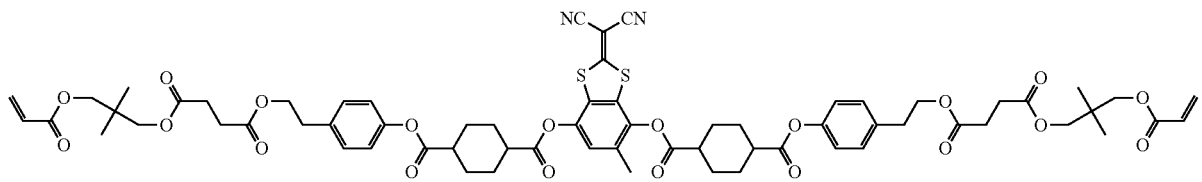

A-1

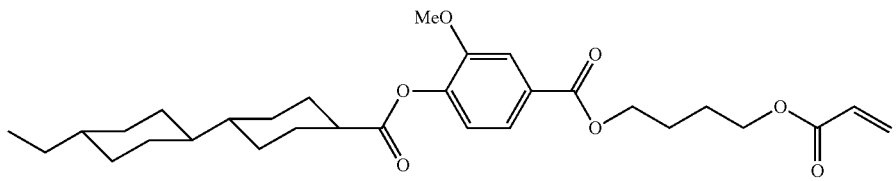

B-1

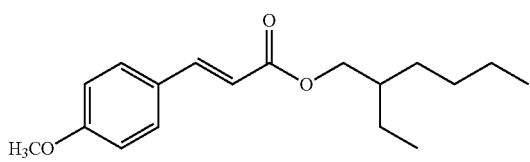

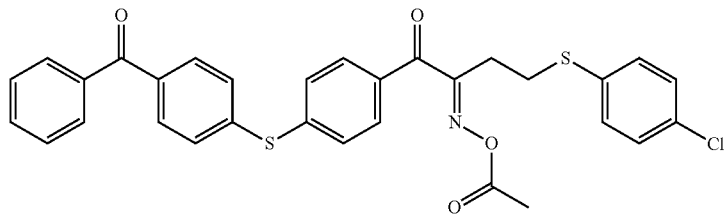

S-1

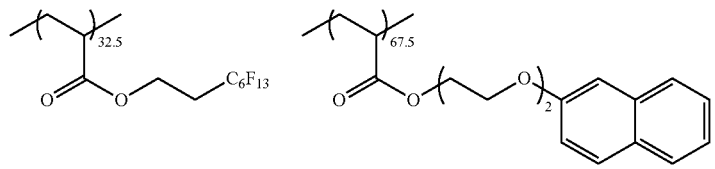

G-1

[Production of Cellulose Acylate Film 1]

<Production of Core Layer Cellulose Acylate Dope>

The following composition was put into a mixing tank and stirred to dissolve components, and a cellulose acetate solution to be used as a core layer cellulose acylate dope was prepared.

| Core Layer Cellulose Acylate Dope | |
|---|---|
| Cellulose Acetate Having Acetyl Substitution Degree of 2.88 | 100 parts by mass |
| Polyester Compound B Described in Examples of JP2015-227955A | 12 parts by mass |
| Following Compound F | 2 parts by mass |
| Methylene Chloride (first solvent) | 430 parts by mass |
| Methanol (second solvent) | 64 parts by mass |

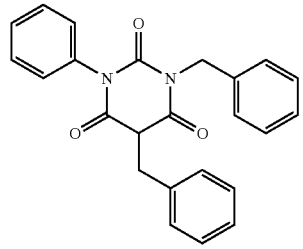

Compound F

<Production of Outer Layer Cellulose Acylate Dope>

10 parts by mass of the following matting agent solution was added to 90 parts by mass of the above-described core layer cellulose acylate dope to prepare a cellulose acetate solution to be used as an outer layer cellulose acylate dope.

| Matting Agent Solution | |
|---|---|
| Silica Grains Having Average Grain Size of 20 nm (AEROSIL R972, manufactured by NIPPON AEROSIL CO., LTD) | 2 parts by mass |
| Methylene Chloride (first solvent) | 76 parts by mass |
| Methanol (second solvent) | 11 parts by mass |
| Above Core Layer Cellulose Acylate Dope | 1 parts by mass |

<Production of Cellulose Acylate Film 1>

The core layer cellulose acylate dope and the outer layer cellulose acylate dope were filtered with filter paper having an average pore size of 34 μm and a sintered metallic filter having an average pore size of 10 μm, and then the three layers of the core layer cellulose acylate dope and the outer layer cellulose acylate dopes on both sides of the core layer cellulose acylate dope were simultaneously cast on a drum at 20° C. from an outlet (band casting machine).

Next, the film was peeled off in a state in which the solvent content was about 20 mass %, and both ends in a width direction of the film were fixed by a tenter clip. The film was dried while being stretched in a transverse direction at a stretching ratio of 1.1.

Then, the film was further dried by being transported between rolls of a heat treatment device, and an optical film having a thickness of 40 μm was produced. The optical film was used as an optical film of Example 20. The in-plane retardation of the obtained cellulose acylate film 1 was 0 nm.

[Production of λ/4 Retardation Film 1]

The photo-alignment film composition 2 prepared previously was applied to one surface of the produced cellulose acylate film 1 using a bar coater.

After the application, the solvent was removed by drying on a hot plate at 120° C. for 1 minute, and a photoisomerization composition layer having a thickness of 0.3 μm was formed.

The obtained photoisomerization composition layer was irradiated with polarized ultraviolet rays (10 mJ/cm$^2$, using an ultra-high-pressure mercury lamp) to form a photo-alignment film.

Next, the optically anisotropic layer coating liquid prepared previously was applied to the photo-alignment film using a bar coater, and a composition layer was formed.

The formed composition layer was heated to 110° C. once on a hot plate, and then cooled to 60° C. to stabilize the alignment.

Thereafter, the temperature was maintained to 60° C., and the alignment was fixed by ultraviolet irradiation (500 mJ/cm$^2$, using an ultra-high-pressure mercury lamp) under a nitrogen atmosphere (oxygen concentration: 100 ppm) to form an optically anisotropic layer having a thickness of 2.3 m, and a λ/4 retardation film 1 was produced. The in-plane retardation of the obtained optical laminate was 140 nm.

[Production of Positive C-Plate Film 2]

A commercially available triacetyl cellulose film "Z-TAC" (manufactured by FUJIFILM Corporation) was used as a temporary support (this is referred to as a cellulose acylate film 2).

A surface temperature of the cellulose acylate film 2 was increased to 40° C. by passing the film through a dielectric heating roll at a temperature of 60° C., and then an alkaline solution having the following composition was applied to one side of the film at a coating rate of 14 ml/m² using a bar coater, heated to 110° C., and transported for 10 seconds under a steam-type far-infrared heater manufactured by NORITAKE CO., LIMITED.

Next, pure water was applied using the same bar coater at 3 ml/m².

Next, water washing by a fountain coater and draining by an air knife were repeated three times, and then the film was transported to a drying zone at 70° C. for 10 seconds and dried to produce an alkali-saponified cellulose acylate film 2.

| Composition of Alkaline Solution (parts by mass) | |
|---|---|
| Potassium Hydroxide | 4.7 parts by mass |
| Water | 15.8 parts by mass |
| Isopropanol | 63.7 parts by mass |
| Fluorine-Containing Surfactant SF-1 ($C_{14}H_{29}O(CH_2CH_2O)_{20}H$) | 1.0 parts by mass |
| Propylene Glycol | 14.8 parts by mass |

The above-described alkali-saponified cellulose acylate film 2 was used, and an alignment film forming coating liquid having the following composition was continuously applied thereto using a wire bar #8. The liquid was dried for 60 seconds by hot air at 60° C., and further dried for 120 seconds by hot air at 100° C., and an alignment film was formed.

| Composition of Alignment Film Forming Coating Liquid | |
|---|---|
| Polyvinyl Alcohol (manufactured by KURARAY CO., LTD., PVA103) | 2.4 parts by mass |
| Isopropyl Alcohol | 1.6 parts by mass |
| Methanol | 36 parts by mass |
| Water | 60 parts by mass |

The following coating liquid N was applied to the cellulose acylate film 2 having the alignment film produced as described above. After aging for 60 seconds at 60° C., the film was irradiated with 1,000 mJ/cm² of ultraviolet rays using an air-cooling metal halide lamp (manufactured by EYE GRAPHICS Co., Ltd.) of 70 mW/cm² in the air to fix the alignment state. Accordingly, the polymerizable rod-like liquid crystal compound was vertically aligned, and a positive C-plate film 2 was produced. Rth at a wavelength of 550 nm was −60 nm.

| Composition of Optically Anisotropic Film Coating Liquid N | |
|---|---|
| Following Liquid Crystalline Compound L-1 | 80 parts by mass |
| Following Liquid Crystalline Compound L-2 | 20 parts by mass |
| Following Vertical Alignment Agent (S01) | 1 part by mass |
| Ethylene Oxide-Modified Trimethylolpropane Triacrylate (V#360, manufactured by OSAKA ORGANIC CHEMICAL INDUSTRY LTD.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Following Compound B03 | 0.4 parts by mass |
| Methyl Ethyl Ketone | 170 parts by mass |
| Cyclohexanone | 30 parts by mass |

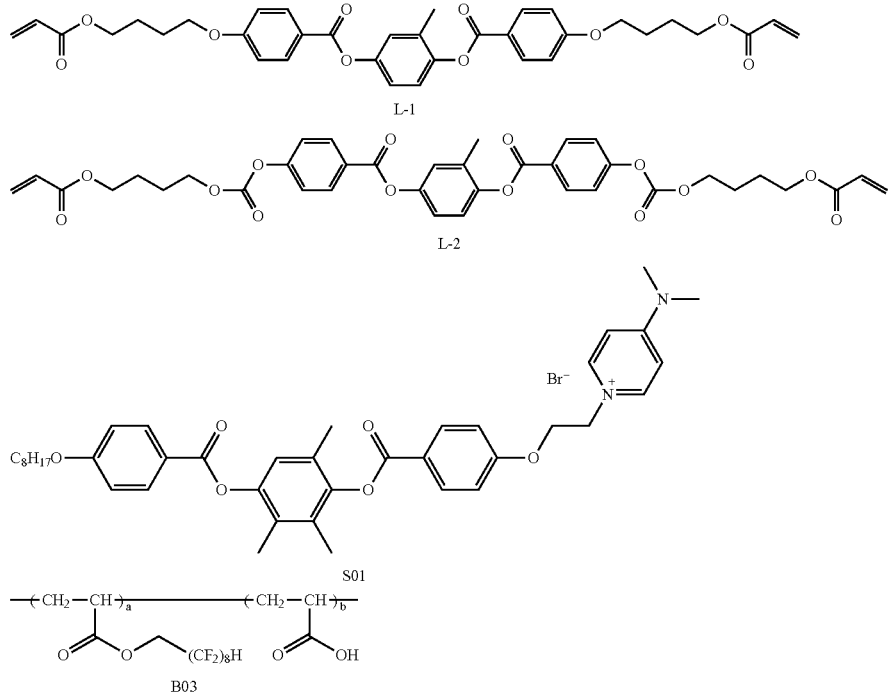

[Production of Circularly Polarizing Plate]

The barrier layer side of the laminate produced in Example 1 was bonded to a side of the λ/4 retardation film 1 on the side of the cellulose acylate film 1 via a pressure sensitive adhesive, and thus a circularly polarizing plate was produced.

Similarly, the optically anisotropic film side of the positive C-plate film 2 produced as described above was transferred to the optically anisotropic layer side of the λ/4 retardation film 1 via a pressure sensitive adhesive, and the cellulose acylate film 2 was removed. Then, the barrier layer side of the laminate produced in Example 1 was bonded to the side of the λ/4 retardation film 1 on the side of the cellulose acylate film 1 via a pressure sensitive adhesive to produce another circularly polarizing plate.

GALAXY S5 manufactured by SAMSUNG, equipped with an organic EL panel (organic EL display element), was disassembled, a touch panel with an attached circularly polarizing plate was peeled off from the organic EL display device, and the circularly polarizing plate was peeled off from the touch panel. The organic EL display element, the touch panel, and the circularly polarizing plate were isolated from each other. Next, the isolated touch panel was bonded again to the organic EL display element, the circularly polarizing plate produced as described above was bonded to the touch panel such that the side of the λ/4 retardation film 1 or the side of the positive-C plate film 2 became the panel side, and an organic EL display device was produced.

The produced organic EL display device was evaluated in the same manner as in a case where PURE-ACE WR (manufactured by TEIJIN LIMITED) was used as a λ/4 plate, and it was confirmed that the same effects were exhibited even in a case where the laminate of the λ/4 retardation film 1 and the positive C-plate film 2 was used as the λ/4 plate.

EXPLANATION OF REFERENCES 10, 20, 30, 40: laminate
12: transparent support
14: alignment film
16: light absorption anisotropic film
18: barrier layer
19: adhesive layer

What is claimed is:

1. A laminate comprising:
a barrier layer A; and
a light absorption anisotropic film B,
wherein the barrier layer A is adjacently provided on the light absorption anisotropic film B,
a relationship between a highest content of a compound Al contained in the barrier layer A and a highest content of a compound B1 contained in the light absorption anisotropic film B satisfies a relationship in which a value of distance calculated from Hansen solubility parameters and represented by Formula (I) is within a range of 0.0 to 5.0, and
the light absorption anisotropic film B contains a component same as the compound A1,
the compound B1 is a compound represented by Formula (1) or a polymer thereof, and
the compound A1 is a polymerizable compound different from the compound represented by Formula (1) or a polymer obtained by polymerizing the polymerizable compound, $$\text{distance} = \{4 \times (\delta_{D(B1)} - \delta_{D(A1)})^2 + (\delta_{P(B1)} - \delta_{P(A1)})^2 + (\delta_{H(B1)} - \delta_{H(A1)})^2\}^{0.5} \quad (I)$$

in Formula (I), $\delta_D$ represents a dispersion element of the Hansen solubility parameter, $\delta_P$ represents a polarity element of the Hansen solubility parameter, and $\delta_H$ represents a hydrogen bond element of the Hansen solubility parameter, in a case where the compound A1 is a polymer, $\delta_{D(A1)}$, $\delta_{P(A1)}$, and $\delta_{H(A1)}$ in Formula (I) each are a Hansen solubility parameter of a monomer which forms a highest content of a repeating unit among repeating units of the polymer, and in a case where the compound A1 is a polymer, the component same as the compound Acontained in the light absorption anisotropic film B refers to a component same as the polymer, or a component same as a monomer which forms a highest content of a repeating unit among repeating units of the polymer $$Q^1-D^1-G^1-D^2-G^2-D^3-Q^2 \quad (1)$$

in Formula (1), $Q^1$ and $Q^2$ each independently represent a hydrogen atom or a monovalent organic group, and at least one of $Q^1$ or $Q^2$ represents a polymerizable group, $D^1$, $D^2$, and $D^3$ each independently represent a single bond, or a divalent linking group which is —(C=O)O—, —O(C=O)—, a substituted or unsubstituted alkylene group having 1 to 20 carbon atoms, a substituted or unsubstituted arylene group having 6 to 40 carbon atoms, a substituted or unsubstituted heteroarylene group having 4 to 30 carbon atoms, a substituted or unsubstituted cycloalkylene group having 6 to 40 carbon atoms, or in which one or more of —CH$_2$— moieties forming the above groups are substituted by —O—, —S—, —NR—, or —PR—, and R represents a hydrogen atom or an alkyl group having 1 to 20 carbon atoms, and $G^1$ and $G^2$ each independently represent a substituted or unsubstituted arylene group having 6 to 40 carbon atoms, a substituted or unsubstituted heteroarylene group having 4 to 30 carbon atoms, or a substituted or unsubstituted cycloalkylene group having 6 to 40 carbon atoms.

2. The laminate according to claim 1, further comprising:
a transparent support on a side of the light absorption anisotropic film B opposite to the barrier layer A; and
an alignment film between the transparent support and the light absorption anisotropic film B.

3. The laminate according to claim 2,
wherein the alignment film contains a component same as the compound A1.

4. The laminate according to claim 1,
wherein a visibility-corrected alignment degree of the light absorption anisotropic film B is 0.90 or greater.

5. The laminate according to claim 1,
wherein the light absorption anisotropic film B is a film formed using a composition containing the compound B1 and a dichroic substance.

6. The laminate according to claim 1, further comprising:
an adhesive layer on a side of the barrier layer A opposite to the light absorption anisotropic film B.

7. The laminate according to claim 6, further comprising:
a λ/4 plate on a side of the adhesive layer opposite to the barrier layer A.

8. A manufacturing method of a laminate having a barrier layer A and a light absorption anisotropic film B, the method comprising:
a light absorption anisotropic film forming step of forming the light absorption anisotropic film B containing 50 mass % or greater of a compound B1 using a composition containing the compound B1; and a barrier layer forming step of forming the barrier layer A containing 50 mass % or greater of a compound A1 on the light absorption anisotropic film B using a composition containing the compound A, wherein a relationship between the compound A1 and the compound B1 satisfies a relationship in which a value of distance calculated from Hansen solubility parameters and represented by Formula (I) is within a range of 0.0 to 5.0, the compound B1 is a compound represented by Formula (1) or a polymer thereof, and the compound A1 is a polymerizable compound different from the compound represented by Formula (1) or a polymer obtained by polymerizing the polymerizable compound, $$\text{distance} = \{4 \times (\delta_{D(B1)} - \delta_{D(A1)})^2 + (\delta_{P(B1)} - \delta_{P(A1)})^2 + (\delta_{H(B1)} - \delta_{H(A1)})^2\}^{0.5} \quad (I)$$

in Formula (I), $\delta_D$ represents a dispersion element of the Hansen solubility parameter, $\delta_P$ represents a polarity element of the Hansen solubility parameter, and $\delta_H$ represents a hydrogen bond element of the Hansen solubility parameter, and in a case where the compound A1 is a polymer, $\delta_{D(A1)}$, $\delta_{P(A1)}$, and $\delta_{H(A1)}$ in Formula (I) each are a Hansen solubility parameter of a monomer which forms a highest content of a repeating unit among repeating units of the polymer, $$Q^1\text{-}D^1\text{-}G^1\text{-}D^2\text{-}G^2\text{-}D^3\text{-}Q^2 \quad (1)$$

in Formula (1), $Q^1$ and $Q^2$ each independently represent a hydrogen atom or a monovalent organic group, and at least one of $Q^1$ or $Q^2$ represents a polymerizable group, $D^1$, $D^2$, and $D^3$ each independently represent a single bond, or a divalent linking group which is —(C=O)O—, —O(C=O)—, a substituted or unsubstituted alkylene group having 1 to 20 carbon atoms, a substituted or unsubstituted arylene group having 6 to 40 carbon atoms, a substituted or unsubstituted heteroarylene group having 4 to 30 carbon atoms, a substituted or unsubstituted cycloalkylene group having 6 to 40 carbon atoms, or in which one or more of —CH$_2$— moieties forming the above groups are substituted by —O—, —S—, —NR—, or —PR—, and R represents a hydrogen atom or an alkyl group having 1 to 20 carbon atoms, and $G^1$ and $G^2$ each independently represent a substituted or unsubstituted arylene group having 6 to 40 carbon atoms, a substituted or unsubstituted heteroarylene group having 4 to 30 carbon atoms, or a substituted or unsubstituted cycloalkylene group having 6 to 40 carbon atoms.

9. An image display device comprising:
the laminate according to claim 1; and
a display element which is installed on a side of the barrier layer A opposite to the light absorption anisotropic film B of the laminate.

10. The laminate according to claim 2,
wherein a visibility-corrected alignment degree of the light absorption anisotropic film B is 0.90 or greater.

11. The laminate according to claim 2,
wherein the light absorption anisotropic film B is a film formed using a composition containing the compound B1 and a dichroic substance.

12. The laminate according to claim 2, further comprising:
an adhesive layer on a side of the barrier layer A opposite to the light absorption anisotropic film B.

13. The laminate according to claim 12, further comprising:
a δ/4 plate on a side of the adhesive layer opposite to the barrier layer A.

14. An image display device comprising:
the laminate according to claim 2; and
a display element which is installed on a side of the barrier layer A opposite to the light absorption anisotropic film B of the laminate.

15. The laminate according to claim 3,
wherein a visibility-corrected alignment degree of the light absorption anisotropic film B is 0.90 or greater.

16. The laminate according to claim 3, wherein the light absorption anisotropic film B is a film formed using a composition containing the compound B1 and a dichroic substance.

17. An image display device comprising:
the laminate according to claim 3; and
a display element which is installed on a side of the barrier layer A opposite to the light absorption anisotropic film B of the laminate.

18. A laminate comprising:
a barrier layer A;
a light absorption anisotropic film B;
a transparent support on a side of the light absorption anisotropic film B opposite to the barrier layer A; and
an alignment film between the transparent support and the light absorption anisotropic film B,
wherein the barrier layer A is adjacently provided on the light absorption anisotropic film B,
a relationship between a highest content of a compound A1 contained in the barrier layer A and a highest content of a compound B1 contained in the light absorption anisotropic film B satisfies a relationship in which a value of distance calculated from Hansen solubility parameters and represented by Formula (I) is within a range of 0.0 to 5.0,
the light absorption anisotropic film B contains a component same as the compound A1, and
the alignment film contains a component same as the compound A1, $$\text{distance} = \{4 \times (\delta_{D(B1)} - \delta_{D(A1)})^2 + (\delta_{P(B1)} - \delta_{P(A1)})^2 + (\delta_{H(B1)} - \delta_{H(A1)})^2\}^{0.5} \quad (I)$$

in Formula (I), $\delta_D$ represents a dispersion element of the Hansen solubility parameter, $\delta_P$ represents a polarity element of the Hansen solubility parameter, and $\delta_H$ represents a hydrogen bond element of the Hansen solubility parameter, in a case where the compound A1 is a polymer, $\delta_{D(A1)}$, $\delta_{P(A1)}$, and $\delta_{H(A1)}$ in Formula (I) each are a Hansen solubility parameter of a monomer which forms a highest content of a repeating unit among repeating units of the polymer, and in a case where the compound A1 is a polymer, the component same as the compound A1 contained in the light absorption anisotropic film B refers to a component same as the polymer, or a component same as a monomer which forms a highest content of a repeating unit among repeating units of the polymer.

* * * * *